(12) United States Patent
Inoue

(10) Patent No.: US 6,677,609 B2
(45) Date of Patent: Jan. 13, 2004

(54) THIN FILM TRANSISTOR, MANUFACTURING METHOD THEREOF, AND CIRCUIT AND LIQUID CRYSTAL DISPLAY DEVICE USING THE THIN FILM TRANSISTOR

(75) Inventor: Satoshi Inoue, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/935,641

(22) Filed: Aug. 24, 2001

(65) Prior Publication Data

US 2002/0005517 A1 Jan. 17, 2002

Related U.S. Application Data

(62) Division of application No. 09/488,038, filed on Jan. 19, 2000, now Pat. No. 6,333,520, which is a division of application No. 09/011,998, filed as application No. PCT/JP97/02233 on Jun. 27, 1997, now Pat. No. 6,084,248.

(30) Foreign Application Priority Data

Jun. 28, 1996 (JP) .............................................. 8-170464
Jul. 23, 1996 (JP) .............................................. 8-211904

(51) Int. Cl.[7] ...................... H01L 29/04; H01L 31/036; H01L 31/0376; H01L 31/20
(52) U.S. Cl. ............................. 257/59; 257/72; 257/350
(58) Field of Search ............................. 257/59, 72, 350

(56) References Cited

U.S. PATENT DOCUMENTS

| 4,514,253 A | 4/1985 | Minezaki |
| 5,266,825 A | 11/1993 | Tsukada et al. |
| 5,395,778 A | 3/1995 | Walker |
| 5,616,935 A | 4/1997 | Koyama et al. |
| 5,714,782 A | 2/1998 | Nakagawa et al. |
| 5,739,574 A | 4/1998 | Nakamura |
| 5,847,422 A | 12/1998 | Chi et al. |

FOREIGN PATENT DOCUMENTS

| CN | 1086045 A | 4/1994 |
| JP | A 2-15669 | 1/1990 |
| JP | A 2-74076 | 3/1990 |
| JP | A 2-214165 | 8/1990 |
| JP | A 4-75387 | 3/1992 |
| JP | A 4-363028 | 12/1992 |
| JP | A 6-85258 | 3/1994 |
| JP | A 6-123896 | 5/1994 |
| JP | A 7-94744 | 4/1995 |
| JP | A 7-115205 | 5/1995 |
| JP | A 7-147411 | 6/1995 |
| JP | A 8-330596 | 12/1996 |
| JP | A 9-74204 | 3/1997 |

Primary Examiner—Ngân V. Ngô
(74) Attorney, Agent, or Firm—Oliff & Berridge, PLC

(57) ABSTRACT

A thin film transistor has a structure capable of decreasing deterioration in Vgs-Ids characteristics. The thin film transistor has a source region composed of an N-type impurity-diffused region, a drain region, and a gate electrode, and a channel region formed directly below the gate electrode. To the source region and the drain region are connected a source electrode and a drain electrode, respectively, through a plurality of contact holes. In the channel region are formed a plurality of P-type impurity-diffused regions at constant intervals.

16 Claims, 33 Drawing Sheets

FIG. IA
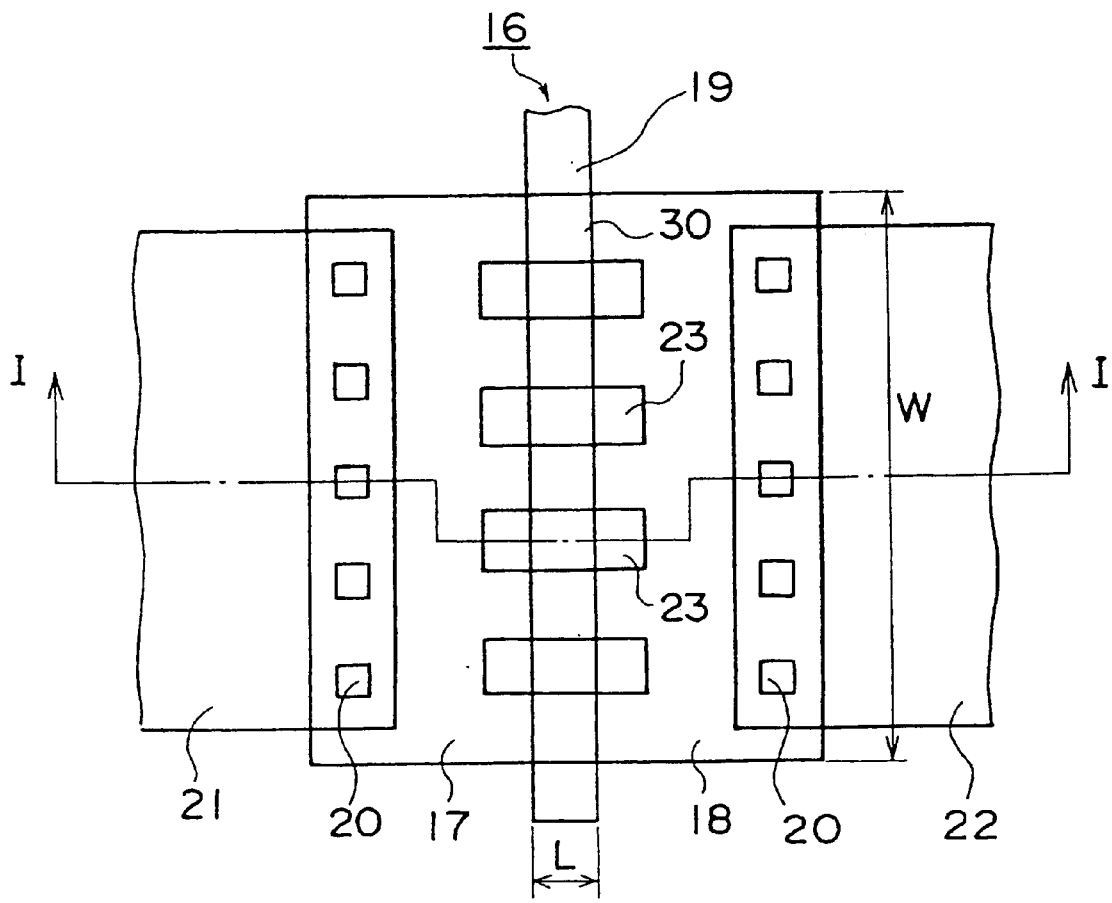
FIG. IB
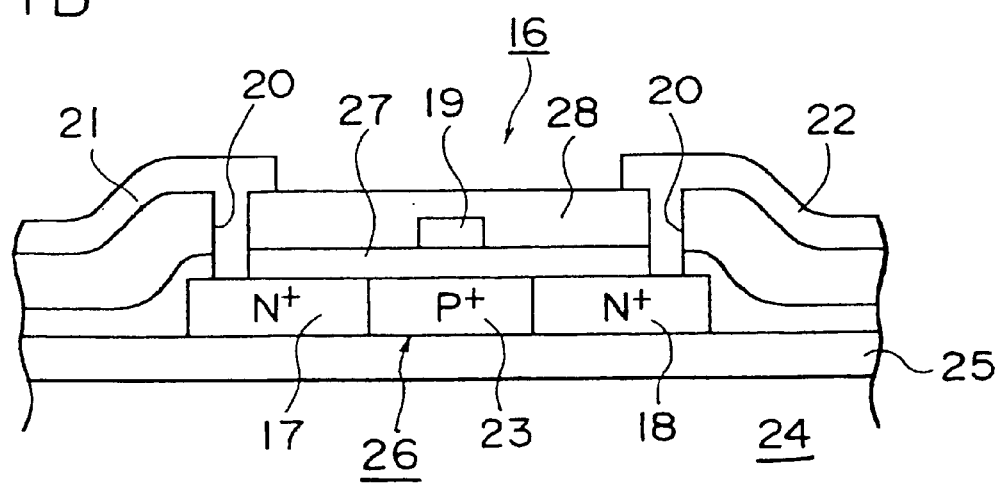

THIN FILM TRANSISTOR, MANUFACTURING METHOD THEREOF, AND CIRCUIT AND LIQUID CRYSTAL DISPLAY DEVICE USING THE THIN FILM TRANSISTOR

This is a Division of application Ser. No. 09/488,038 filed Jan. 19, 2000, now U.S. Pat. No. 6,333,520 which in turn is a divisional of application Ser. No. 09/011,998 filed Feb. 23, 1998, now U.S. Pat. No. 6,084,248 which is a U.S. National Stage of PCT/JP97/02233, filed Jun. 27, 1997. The entire disclosure of the prior applications is hereby incorporated by reference herein in its entirety.

BACKGROUND OF THE INVENTION

1. Field of Invention

The present invention relates to a thin film transistor, a manufacturing method a thin film transistor, and a circuit and a liquid crystal display device each incorporating the thin film transistor.

2. Description of Related Art

A polycrystalline silicon thin film transistor which can be formed at low processing temperature, i.e., "low temperature processed polysilicon TFT", attracts attention as an element which enables the formation of a high-definition liquid crystal display comprising a large glass substrate containing a driver.

FIG. 38A and FIG. 38B, which is a sectional view taken along line B—B of FIG. 38A, show, as an example of conventional polysilicon TFT, a top gate type TFT in which a polysilicon thin film which forms source and drain regions is positioned on the lower side, and a gate electrode is positioned on the upper side. This polysilicon TFT is an example of an N-channel TFT.

As shown in FIGS. 38A and 38B, a buffer layer 2 comprising a silicon oxide film is formed on a glass substrate 1, and a polysilicon thin film 3 is formed on the buffer layer 2. Further, a gate insulation film 4 comprising a silicon oxide film is formed to cover the polysilicon thin film 3, and a gate electrode 5 comprising a tantalum nitride film, an aluminum (Al) film or the like is formed. Further, a source region 6 and a drain region 7 into which an N-type impurity is introduced are formed in portions of the polysilicon thin film 3 except at a portion directly below the gate electrode. Also, a layer insulation film 8 comprising a silicon oxide film is formed, contact holes 9 are formed, and a source electrode 10 and a drain electrode 11 are formed.

In the field of general semiconductor devices, in order to achieve a high-speed device, low power consumption, and higher function, miniaturization of devices and utilization of a SOI (Silicon On Insulator) structure have recently attracted attention. In the SOI structure, for example, single crystal silicon layers are formed to hold a silicon oxide film therebetween on the surface of a silicon substrate. However, while the SOI structure has the above advantages it also is influenced by a substrate floating effect because the transistor formation region and the support substrate are electrically isolated. In this case, the problem caused by the substrate floating effect is, for example, deterioration in voltage resistance between the source and drain. This occurs because the holes generated in a high electric field region near the drain region accumulate in a portion below the channel to increase the potential of the channel portion, and thus a parasitic bipolar transistor comprising source, channel and drain regions which serve as an emitter, a base and a collector, respectively, is turned on.

On the other hand, when a polysilicon TFT constructed as shown in FIGS. 38A and 38B is used as a liquid crystal driving element, a signal voltage is applied between the source electrode 10 and the drain electrode 11, and a scanning voltage is applied to the gate electrode 5. However, in this case, the same deterioration in characteristics which occur in the SOI structure due to the substrate floating effect also occurs.

Also, significant deterioration in TFT has been apparent. Since the channel region of TFT is surrounded by an insulation film, a structure is formed in which heat hardly escapes. Therefore, deterioration occurs due to the heat of the TFT itself which is generated during operation. Such deterioration significantly occurs in a TFT having a large channel width.

A polycrystalline silicon TFT exhibits a large leakage current (off current) during an off time and large variations in the amount of current, as compared with a single crystal silicon transistor. This tendency is more significant in low-temperature processed TFTs than TFTs formed by a high temperature process.

For example, as the leakage current (off current) of the TFT of a pixel portion increases, the luminance of a display screen largely varies, and TFT design becomes difficult due to variations in the leakage current (off current).

The present invention solves the above problem.

SUMMARY OF THE INVENTION

An object of the present invention is to provide a thin film transistor having a structure in which the leakage current (off current) of the TFT is decreased, and variations in the leakage current (off current) are suppressed, a method of manufacturing a TFT, and a circuit and a liquid crystal display device each incorporating the thin film transistor.

In order to achieve the object, a thin film transistor of the present invention comprises a channel region formed in a non-single crystal silicon thin film on a substrate, first and second regions of a first conduction type formed in the non-single crystal silicon thin film to be separated with the channel region therebetween, and a carrier injection region into which carriers of the conduction type opposite to the first conduction type are generated in a high electric field region near the first or second region flow.

In accordance with the present invention, since the carrier injection region, into which hot carriers generated in the electric field region are flowed, is provided, the amount of the hot carriers flowing into the first or second region is decreased, thereby significantly decreasing deterioration in characteristics, as compared with a conventional thin film transistor.

The thin film transistor of the present invention comprises a channel region formed in a non-single crystal silicon thin film on a substrate, first and second regions of a first conduction type formed in the non-single crystal silicon thin film separated with the channel region therebetween, and at least one third region of the conduction type opposite to the first conduction type which is formed between the first and second region in the non-single crystal silicon thin film.

In the present invention, a plurality of third regions may be formed on the non-single crystal silicon thin film.

The third region may be formed between at least one of the first and second regions and the channel region in the non-single crystal silicon thin film.

The third region may be formed in at least a portion of the channel region.

The first conduction type may be the N type.

The non-single crystal silicon thin film may be a polycrystalline silicon thin film.

The polycrystalline silicon thin film having the channel region, first region and second region may be formed by a low temperature process.

The thin film transistor of the present invention comprises a channel region formed in a non-single crystal silicon thin film on a substrate, and first and second regions of a first conduction type formed in the non-single crystal silicon thin film separated with the channel region therebetween, wherein the width of at least the channel region of the non-single crystal silicon thin film is larger than the minimum width of the first and second regions.

The width of the channel region is preferably 50 $\mu$m or more.

The width of the channel region is preferably 100 $\mu$m or more.

The thin film transistor of the present invention comprises a plurality of non-single crystal silicon thin films formed to cross a gate electrode on a substrate, a channel region formed in each of the non-single crystal silicon thin films, and first and second regions of a first conduction type formed in the non-single crystal silicon thin film separated by the channel region therebetween, wherein the first and second regions of the plurality of non-single crystal silicon thin films are respectively connected to common electrodes.

The channel width of each of the non-single crystal silicon thin films is preferably 10 $\mu$m or less.

The dimension between the outermost sides of the plurality of non-single crystal silicon thin films is preferably 50 $\mu$m or more.

The length of the channel region is preferably 4 $\mu$m.

The thin film transistor of the present invention comprises a semiconductor thin film island provided on a substrate, source and drain layers formed by selectively introducing an impurity into the semiconductor thin film island, and a gate electrode layer provided opposite to the semiconductor thin film island through an insulation film, wherein at least one of the source layer and the drain layer is formed inside the semiconductor thin film island at a predetermined distance from the outer edge thereof.

Generally, a large leakage current (off current) of a TFT is due to "crystal quality". However, as a result of various further studies by the inventors of this application, it was found that the leakage current (off current) of the TFT is significantly affected by "the edges of high-concentration source and drain layers which constitute a portion of the outer edge (periphery) of the thin film island, and an electric field between the gate electrode and the thin film island".

The high-concentration source layer and drain layer are provided inside the thin film island to provide a "space" in the outer edge portion, and thus the space relieves the electric field applied to the drain layer. Therefore, a decrease in the leakage current (off current) and suppression of variations thereof are achieved.

A portion of the outer edge of the semiconductor thin film island, which is a region away from the source layer and the drain layer and which overlaps with at least the gate electrode, may comprise an intrinsic layer into which no impurity is introduced.

The "space" described above is defined as the intrinsic layer. In the intrinsic layer, a depletion layer easily extends, and absorbs the electric field. Therefore, the electric field applied to the high-concentration source layer and drain layer is decreased, the leakage current (off current) of TFT is decreased, and current variations are suppressed.

A portion of the outer edge of the semiconductor thin film island, which is a region away from the source layer and the drain layer and which overlaps with at least the gate electrode, may comprise an impurity layer into which an impurity of the conduction type opposite to the source layer and the drain layer is introduced, and an intrinsic layer connected to the impurity layer.

For example, in the case of a NMOS transistor, a portion of the outer edge of the thin film island, which overlaps with at least the gate electrode, has a p layer and an i layer (intrinsic layer). In this case, an electric field relieving effect is obtained, and the leakage current (off current) is decreased, and current variations are suppressed.

The predetermined distance between the outer edge of the semiconductor thin film island to the source or drain is preferably 1 $\mu$m to 5 $\mu$m.

If the distance between the outer edge of the semiconductor thin film island and the source (drain) is less than 1 $\mu$m, processing is difficult. If the distance is over 5 $\mu$m, the size of the semiconductor thin film island is consequently increased, and design specifications are not satisfied. Therefore, the distance is preferably 1 $\mu$m to 5 $\mu$m.

The semiconductor thin film island may comprise polysilicon which is formed by annealing amorphous silicon.

A polysilicon TFT formed by a low temperature process is unable to recover from crystal damage because it is not processed at a high temperature, and the leakage current (off current) of the TFT is liable to increase. Therefore, the present invention can be effectively applied to a polysilicon TFT.

The thin film transistor may have an offset in the relative positional relation between the gate electrode and the drain layer.

The so-called "offset structure" has no overlap of the gate and the drain, and is thus effective to decrease the leakage current (off current), while a large offset amount causes a decrease in the on current and an increase in the threshold voltage. Therefore, it is difficult to control the offset amount.

When the present invention is applied to an offset structure MOS transistor, even if the offset amount is not much increased, the leakage current (off current) can effectively be decreased, and current variation are suppressed, thereby facilitating the guarantee of the on current and design.

The thin film transistor may have a dual gate structure in which two gate electrodes are arranged in parallel with each other.

A dual gate structure MOSFET comprises two MOS transistors which are connected in series. In operation the electric field relieving structure of the present invention decreases the leakage current of each MOSFET, and when a rate of reduction (the amount of leakage current after application of the present invention/the amount of leakage current before application) of one MOSFET is "F (<1)", the total rate of reduction in the leakage current of the two MOSFETs is "F×F", thereby further decreasing the amount of the leakage current compared to one MOSFET.

The thin film transistor of the present invention comprises a semiconductor thin film island provided on a substrate, a source layer and a drain layer formed by selectively introducing an impurity into the semiconductor thin film island, a first insulation film provided to overlap with only the outer edge of the semiconductor thin film island, a second insulation film formed to cover the surface of the semiconductor thin film island and the first insulation film, and a gate electrode layer provided on the second insulation film.

In the present invention, in order to relieve the electric field between the gate electrode and the source and drain, the first insulation film overlaps the outer edge of the thin film island, and the distance to the edge of the gate is increased by an amount corresponding to the thickness of the first insulation film. As a result, an electric field applied to the source and drain is relieved, the leakage current (off current) of TFT is decreased, and current variations are suppressed.

A circuit in accordance with the present invention comprises the thin film transistor.

The liquid crystal display device in accordance with the present invention is a build-in driver type circuit and comprises the thin film transistor.

The use of the thin film transistor of the present invention decreases the occurrence of operation error in the circuit, and can result in a liquid crystal display device having good image quality.

In the liquid crystal display device, the thin film transistor is preferably used in the circuit portion.

In the liquid crystal display device, the thin film transistor is preferably used as an analog switch means of the circuit portion.

In the liquid crystal display device of the present invention, the thin film transistor is used in the pixel portion.

The leakage current (off current) of the TFT of the pixel portion is decreased, and variations in luminance of the display screen are decreased. Also, variations in the leakage current (off current) of a TFT are suppressed, thereby facilitating design of an active matrix substrate. Therefore, a liquid crystal display device having high performance is realized.

The liquid crystal display device of the present invention comprises the thin film transistor.

When a peripheral circuit such as a liquid crystal driver circuit or the like comprises the TFT of the present invention, a high-performance circuit is realized. The circuit can easily be formed on an active matrix substrate. Therefore, a high-performance liquid crystal display device is realized.

A method of manufacturing the thin film transistor in accordance with the present invention includes forming a channel region in a non-single crystal silicon thin film on a substrate, forming first and second regions of a first conduction type in the non-single crystal silicon thin film separated by the channel region forming, third regions of the conduction type opposite to the first conduction type between the first region and the channel region and between the second region and the channel region, the channel region being of the conduction type opposite to the first conduction type. The method also comprising the silicon thin film forming step of forming a non-single crystal silicon thin film on the substrate, the third region forming step of implanting an impurity ion of the conduction type opposite to the first conduction type into a portion of the non-single crystal silicon thin film to form the third regions, the gate electrode forming step of forming the gate electrode on the third regions of the non-single crystal silicon thin film through a gate insulation film, and the first and second region forming step of forming the first region and second region by implanting an impurity ion of the first conduction type with a dosage smaller than that of ion implantation in the third region forming step.

A method of manufacturing the thin film transistor in accordance with the present invention also includes forming a channel region in a non-single crystal silicon thin film on a substrate, forming first and second regions of a first conduction type in the non-single crystal silicon thin film to be separated with the channel region forming, third regions of the conduction type opposite to the first conduction type between the first region and the channel region and between the second region and the channel region. The method also comprising the silicon thin film forming step of forming the non-single crystal silicon thin film on the substrate, the gate electrode forming step of forming the gate electrode on the non-single crystal silicon thin film through a gate insulation film, the third region forming step of forming the third regions in regions adjacent to the channel region by implanting an impurity ion of the conduction type opposite to the first conduction type using the gate electrode as a mask and a mask material which covers the fist region and second regions, and the first and second region forming step of forming the first region and second region in regions adjacent to the third regions of the non-single crystal silicon thin film by implanting an impurity ion of the first conduction type with a dosage smaller than that of ion implantation in the third region forming step.

The method of manufacturing the thin film transistor in accordance with the present invention includes manufacturing a thin film transistor used for a liquid crystal display device comprising a complementary thin film transistor having both P-type and N-type transistors and comprising a channel region formed in a non-single crystal silicon thin film on a substrate, first and second regions of a first conduction type formed in the non-single crystal silicon thin film separated by the channel region, third regions of the conduction type opposite to the first conduction type which are formed between the first region and the channel region and between the second region and the channel region, the method comprising forming the third regions at the same time as the formation of the first and second regions comprising a transistor of the conduction type opposite to the first conduction type.

The method of manufacturing a thin film transistor in accordance with the present invention comprises, the step of depositing an amorphous silicon thin film, the step of irradiating the amorphous silicon thin film with a laser beam to obtain a crystallized polysilicon thin film, the step of forming a polysilicon island by patterning the polysilicon thin film obtained by laser irradiation, forming a gate insulation film on the polysilicon island and forming a gate electrode on the gate insulation film, the step of forming an insulation layer to cover at least a portion of the outer edge of the polysilicon island, the step of forming a source layer and drain layer by introducing an impurity into the polysilicon island using the gate electrode and the insulation layer as masks, and the step of forming a source electrode and drain electrode.

The source layer and drain layer can be formed inside the outer edge of the thin film island in a self alignment manner using the gate electrode and the insulation layer as masks.

BRIEF DESCRIPTION OF THE DRAWINGS

FIGS. 1A and 1B are drawings showing a thin film transistor in accordance with a first embodiment of the present invention;

DETAILED DESCRIPTION OF PREFERRED EMBODIMENTS

Figure 2A:
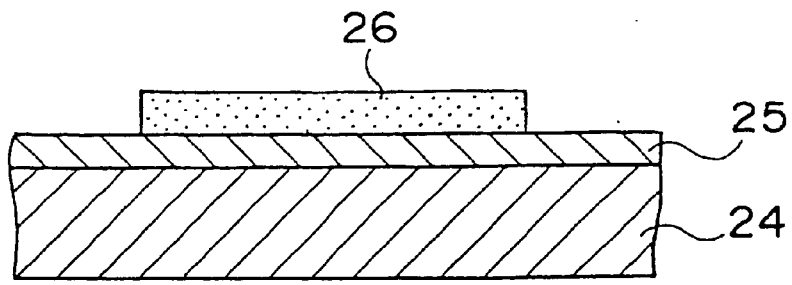
FIGS. 2A to 2C are process flow diagrams showing the steps of a method of manufacturing a thin film transistor in turn.

A first embodiment of the present invention will be described below with reference to FIGS. 1A to 3D.

FIGS. 1A and 1B are drawings showing a thin film transistor 16 in accordance with this embodiment, the thin film transistor 16 comprising polysilicon TFT used as, for example, an analog switch for a liquid crystal display.

FIG. 1A is a plan view of the thin film transistor 16. As shown in these drawings, the thin film transistor 16 has a source region 17 (first region) and a drain region 18 (second region) both of which are N-type (first conduction type) impurity-diffused regions, a gate electrode 19, and a channel region 30 formed directly below the gate electrode 19.

The ratio of the channel length L to the channel width W of the thin film transistor 16 is, for example, about 5 μm/100 μm. To the source region 17 and the drain region 18 are connected a source electrode 21 and a drain electrode 22, respectively, through a plurality of contact holes 20. A plurality of P-type impurity diffused regions 23 (carrier injection regions, third regions of the conduction type opposite to the first conduction type) are formed continuously over the drain region 18, the channel region 30 and the source region 17 at constant intervals. For example, the width of the P-type impurity-diffused regions 23 is about 5 μm, and the distance between the respective P-type impurity-diffused regions 23 is about 5 μm.

FIG. 1B is a sectional view taken along line I—I of FIG. 1A. As shown in this drawing, on a glass substrate 24 are formed in turn a base insulation film 25 comprising a silicon oxide film, and a polycrystalline silicon thin film 26 in which the source and drain regions 17 and 18, and the P-type impurity-diffused regions 23 are formed. On the polycrystalline silicon thin film 26 is formed the gate electrode 19 through a gate insulation film 27. Also, a layer insulation film 28 comprising a silicon oxide film is formed on the gate electrode 19, the contact holes 20 are formed to pass through the layer insulation film 28 and communicate with the source region 17 and the drain region 18, and a source electrode 21 and a drain electrode 22 are formed.

The method of manufacturing the thin film transistor having the above described configuration will be described below with reference to FIGS. 2A to 3D. The manufacturing method employs a CVD process for forming the gate insulation film, not a thermal oxidation process, and a low process temperature of 450° C. or less over the entire process for manufacturing. Therefore, glass can be used as a material for the substrate.

First, as shown in FIG. 2A, a silicon oxide film having a thickness of about 100 to 500 nm is formed over the entire surface of the glass substrate 24 by using the CVD process to form the base insulation film 25. Next, an amorphous silicon thin film having a thickness of about 50 nm is formed over the entire surface of the base insulation film 25 by the CVD process using disilane ($Si_2H_6$) or monosilane ($SiH_4$) as a raw material, followed by excimer laser annealing using XeCl or the like to form a polycrystalline silicon thin film. Then, the polycrystalline silicon thin film 26 is patterned by using a known photolithographic etching technique (silicon thin film forming step).

Figure 2B:
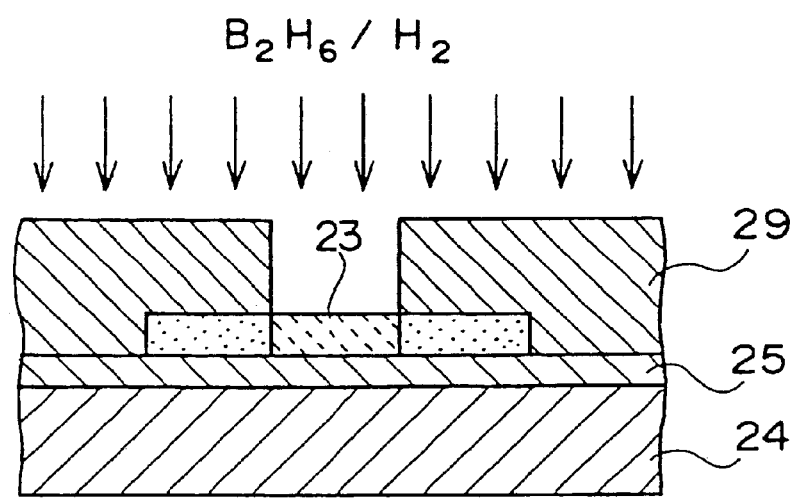
Figure 2C:
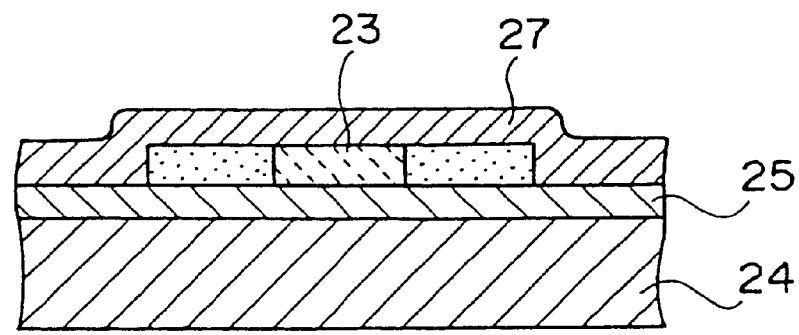

Next, as shown in FIG. 2B, a photoresist pattern 29 having openings formed only in regions where the P-type impurity-diffused regions are formed is formed, followed by ion doping with $B_2H_6/H_2$ to form the P-type impurity-diffused regions 23 (third region forming step). In ion doping, the dosage is, for example, about 1 to $10 \times 10^{15}$ atoms/cm². After the photoresist pattern 29 is then removed, the gate insulation film 27 comprising a silicon oxide film having a thickness of about 120 nm is formed by an ECR-CVD (Electron Cyclotron Resonance Chemical Vapor Deposition) process, as shown in FIG. 2C.

Figure 3A:
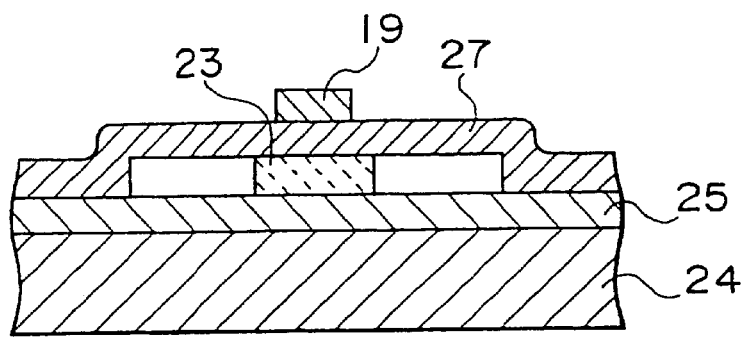
FIGS. 3A to 3D are process flow diagrams showing the steps of a method of manufacturing a thin film transistor in turn.
Figure 3B:
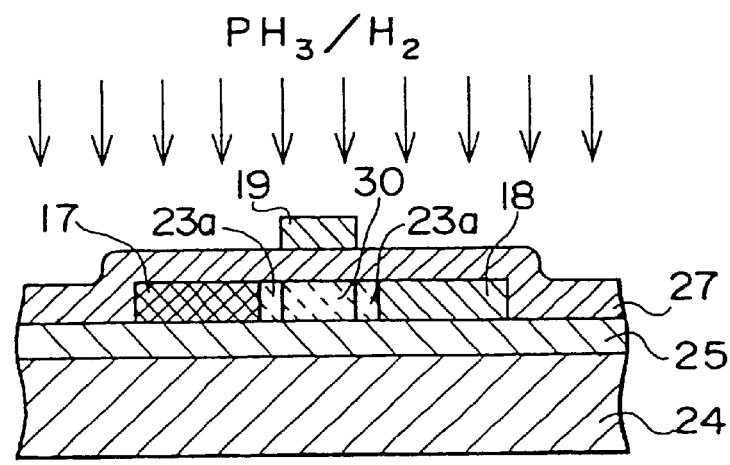

Next, a tantalum film having a thickness of about 600 to 800 nm is deposited over the entire surface by a sputtering process, and then patterned to form the gate electrode 19 (gate electrode forming step), as shown in FIG. 3A. Next, the source region 17 and the drain region 18, which are N-type impurity-diffused regions, are formed by ion doping with $PH_3/H_2$ using the gate electrode 19 as a mask, as shown in FIG. 3B (first and second region forming step). In ion doping, although the dosage may be about 1 to $10 \times 10^{15}$ atoms/cm², the dosage is set to a value smaller than the dosage of $B_2H_6/H_2$ in the ion doping step shown in FIG. 2B. At this time, P-type impurities and N-type impurities are introduced into the regions 23a between the channel region 30 and the source and drain regions 17 and 18, but the set value of the dosage allows the regions 23a to remain the P type. Then, annealing is carried out at 300° C. for 2 hours.

Figure 3C:
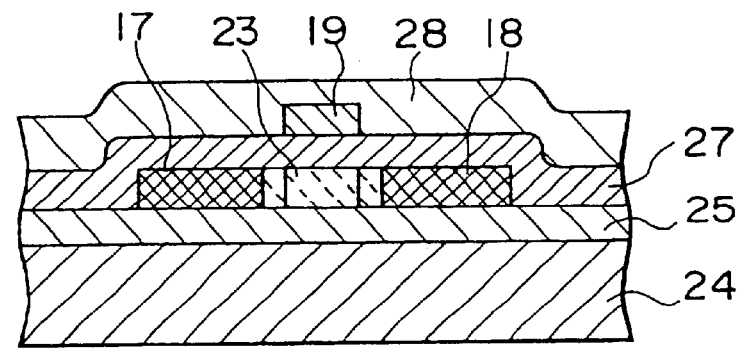
Figure 3D:
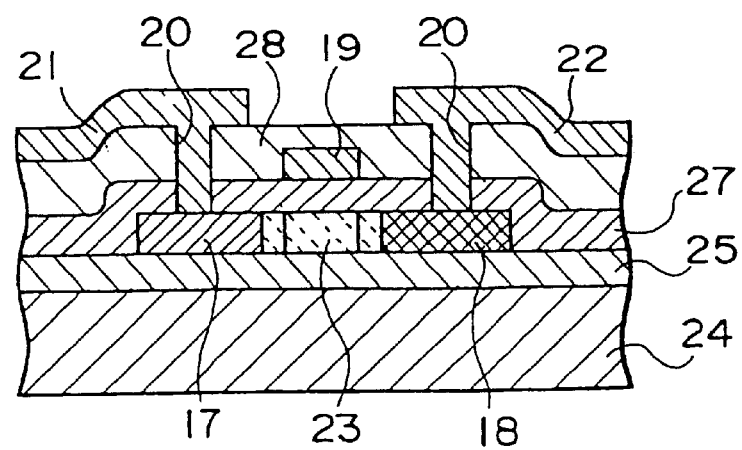

Then, the layer insulation film 28 comprising a silicon oxide film having a thickness of about 500 to 1000 nm is formed by the CVD process, as shown in FIG. 3C. Finally, the contact holes 20 are formed to pass through the layer insulation film 28 and communicate with the source region 17 and the drain region 18 on the polycrystalline silicon thin film 26, and a Al—Si—Cu film is then deposited over the entire surface and patterned to form the source electrode 21 and the drain electrode 22, as shown in FIG. 3D.

In the thin film transistor 16 of this embodiment, when an analog switch is turned on by applying a voltage between the source electrode 21 and the drain electrode 22, electrons are injected from the source region 17 to the drain region 18, and accelerated in a high electric field region near the drain region 18 to generate hot carriers (pairs of electrons and holes) by impact ionization. Unlike a conventional thin film transistor, the thin film transistor 16 of this embodiment comprises the P-type impurity diffused regions 23 provided in the drain region 18, and thus part of the generated holes flow into the P-type impurity-diffused regions 23 with low potential. As a result, the number of the holes injected into the source region 17 is significantly decreased, thereby significantly decreasing the deterioration in characteristics whereby the Vgs-Ids characteristic curve is shifted to the depletion side, as compared with a conventional thin film transistor.

Also, in the structure of this embodiment, the P-type impurity-diffused region 23 is not provided at a single position, but a plurality of the P-type impurity-diffused regions are uniformly provided, and the holes generated in any portion in the drain region 18 easily flow into the P-type impurity-diffused regions 23, thereby further decreasing the characteristic deterioration.

Although this embodiment has a structure in which the P-type impurity-diffused regions 23 contact the source region 17 and the drain region 18, a structure in which the P-type impurity-diffused regions are formed independently in the channel region may be used.

A second embodiment of the present invention will be described below with reference to FIGS. 4A to 7D.

Figure 4A:
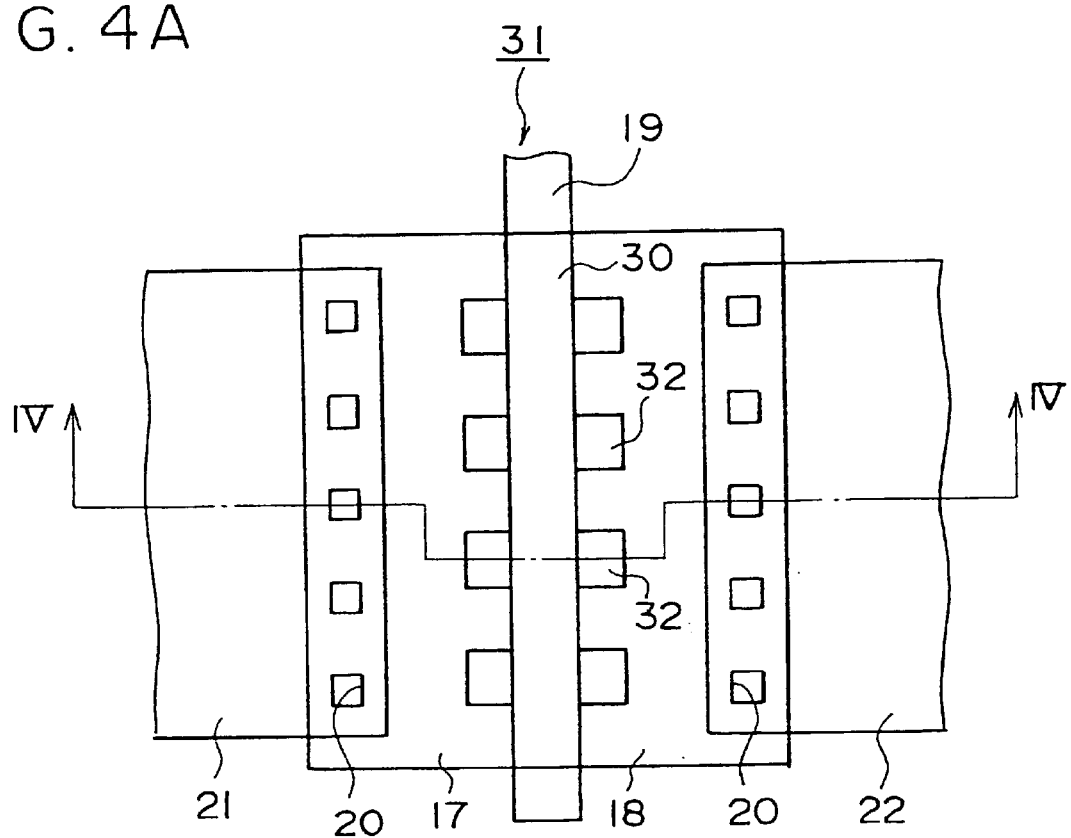
FIGS. 4A and 4B are drawings showing a thin film transistor in accordance with a second embodiment of the present invention.
Figure 4B:
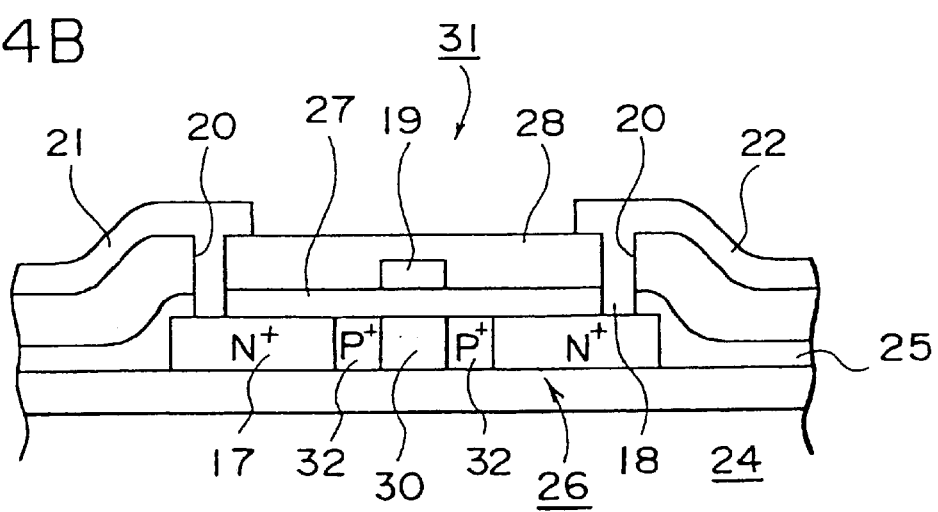

FIGS. 4A and 4B are drawings showing a thin film transistor 31 of this embodiment, and FIG. 4B is a sectional view taken along line IV—IV in FIG. 4A. The thin film transistor 31 of this embodiment is different from the thin film transistor of the first embodiment in only the structure of the P-type impurity-diffused regions. Therefore, in FIGS. 4A and 4B, components common to those shown in FIGS. 1A and 1B are denoted by the same reference numerals, and a description thereof is omitted.

As shown in FIGS. 4A and 4B, the thin film transistor 31 comprises the source region 17 (first region) and the drain region (second region) both of which are N-type (first conduction type) impurity-diffused regions, the gate electrode 19 and the channel region 30 formed directly below the gate electrode 19. To the source region 17 and the drain region 18 are connected the source electrode 21 and the drain electrode 22, respectively, through the plurality of contact holes 20. Unlike the first embodiment, each of the plurality of P-type impurity-diffused regions 32 (carrier injection regions, the third regions) is formed in the drain region 18 and the source region 17, except in the channel region 30 and is thus divided into two regions.

The method of manufacturing the thin film transistor of this embodiment will be described below with reference to FIGS. 5A to 6C.

Figure 5A:
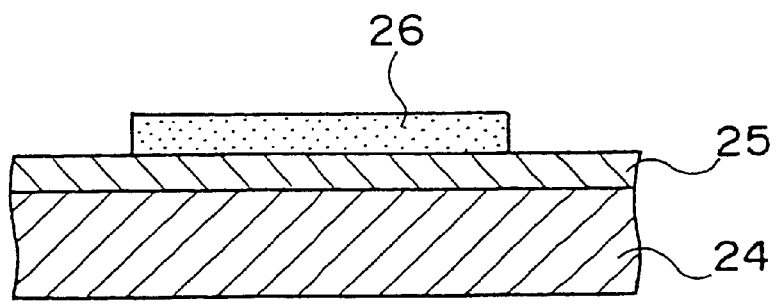
FIGS. 5A to 5C are process flow diagrams showing the steps of a method of manufacturing a thin film transistor in turn.

First, as shown in FIG. 5A, a silicon oxide film having a thickness of about 100 to 500 nm is formed over the entire surface of the glass substrate 24 by using the CVD process to form the base insulation film 25. Next, an amorphous silicon thin film having a thickness of about 50 nm is formed over the entire surface of the base insulation film 25 by the CVD process using disilane or monosilane as a raw material, followed by excimer laser annealing using XeCl or the like to form a polycrystalline silicon thin film. Then the polycrystalline silicon thin film 26 is patterned by using a known photolithographic etching technique (the silicon thin film forming step).

Figure 5B:
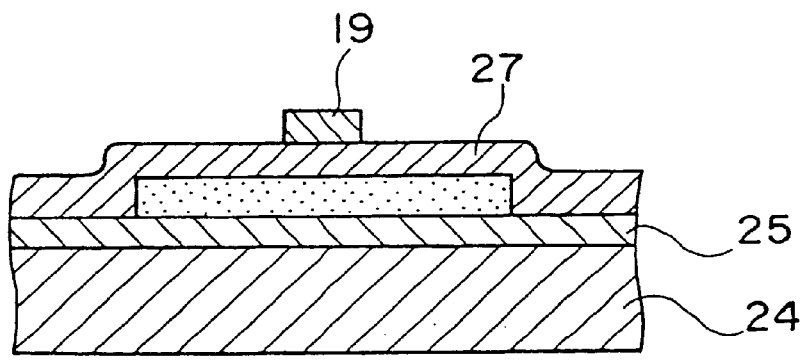

Next, as shown in FIG. 5B, the gate insulation film 27 comprising a silicon oxide film having a thickness of about 120 nm is formed by the ECR-CVD process. Then a tantalum film having a thickness of about 600 to 800 nm is deposited over the entire surface by the sputtering process, and patterned to form the gate electrode 19 (the gate electrode forming step).

Figure 5C:
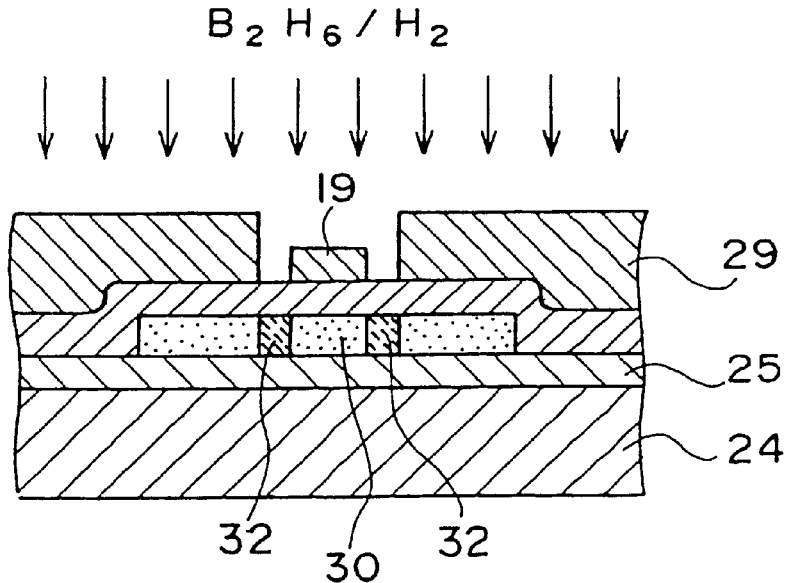

Next, as shown in FIG. 5C, a photoresist pattern 29 having openings formed in regions where the P-type impurity-diffused regions 32 are formed and the region where the gate electrode 19 was formed is formed, followed by ion doping with $B_2H_6/H_2$ to form the P-type impurity-diffused regions 32 in only the portions adjacent to the channel region 30 by ion implantation using the gate electrode 19 and the photoresist pattern 29 as a mask material (the third region forming step). In ion doping, the dosage is, for example, about 1 to $10 \times 10^{15}$ atoms/cm$^2$.

Figure 6A:
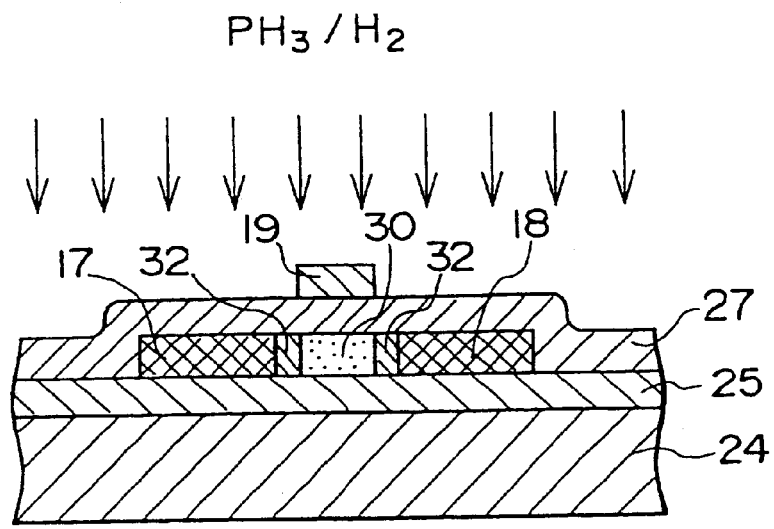
FIGS. 6A to 6C are process flow diagrams showing the steps of a method of manufacturing a thin film transistor in turn.

After the photoresist pattern 29 is then removed, the source region 17 and the drain region 18, which are N-type impurity-diffused regions, are formed by ion doping with $PH_3/H_2$ using the gate electrode 19 as a mask, as shown in FIG. 6A (the first and second region forming step). In ion doping, although the dosage may be about 1 to $10 \times 10^{15}$ atoms/cm$^2$, it is set to a value smaller than the dosage of $B_2H_6/H_2$ in the ion doping step shown in FIG. 5C. At this time, P-type impurities and N-type impurities are introduced into the regions 32 between the channel region 30 and the source and drain regions 17 and 18, but the above set value of the dosage allows the regions 32 to remain the P type. Then, annealing is carried out at 300° C. for 2 hours.

Figure 6B:
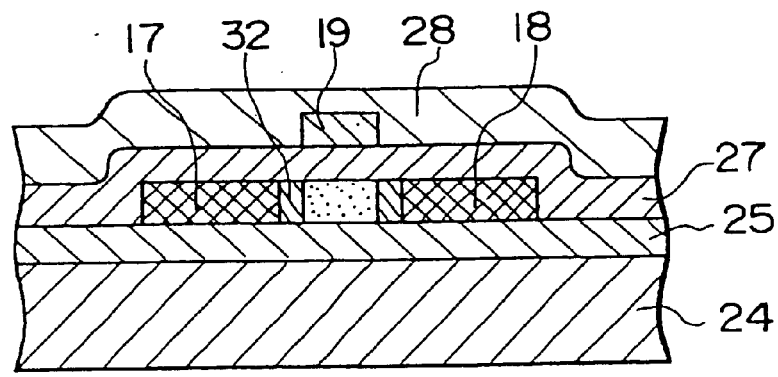
Figure 6C:
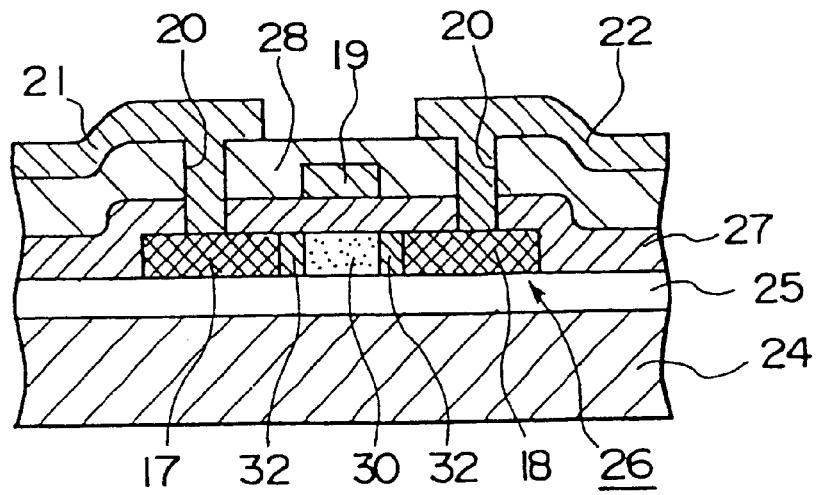

Then, the layer insulation film 28 comprising a silicon oxide film having a thickness of about 500 to 1000 nm is formed by the CVD process, as shown in FIG. 6B. Finally, the contact holes 20 are formed so as to pass through the layer insulation film 28 and communicate with the source region 17 and the drain region 18 on the polycrystalline silicon thin film 26, and a Al—Si—Cu film is then deposited over the entire surface and patterned to form the source electrode 21 and the drain electrode 22, as shown in FIG. 6C.

Although a method of manufacturing a single N-channel TFT has been described above, in the case of a liquid crystal display device comprising complementary (CMOS type) TFT having both a P-channel TFT and a N-channel TFT, the P-type impurity-diffused regions 32 of the thin film transistor 31 comprising N-channel TFT can be formed at the same time as the formation of the source and drain regions of the P-channel TFT. An example of such a method will be describe below with reference to FIGS. 7A to 7D.

Figure 7A:
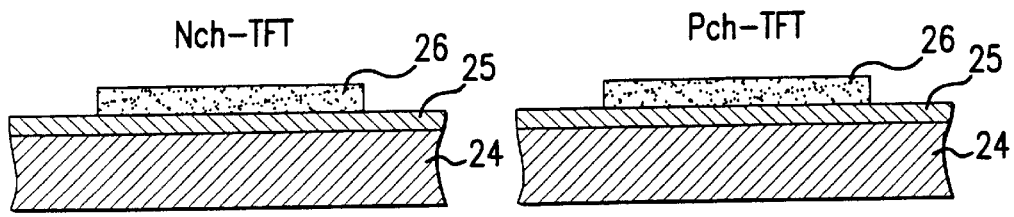
FIGS. 7A to 7D are process flow diagrams showing the steps of a method of manufacturing a thin film transistor in turn.

As shown in FIG. 7A, a silicon oxide film having a thickness of about 100 to 500 nm is formed over the entire surface of the glass substrate 24 by using the CVD process to form the base insulation film 25. Next, an amorphous silicon thin film having a thickness of about 50 nm is formed over the entire surface of the base insulation film 25 by the CVD process using disilane or monosilane as a raw material, followed by excimer laser annealing using XeCl or the like to form a polycrystalline silicon thin film. Then, the polycrystalline silicon thin film is patterned by using a known photolithographic etching technique to form the polycrystalline silicon thin film 26 (silicon thin film forming step).

Figure 7B:
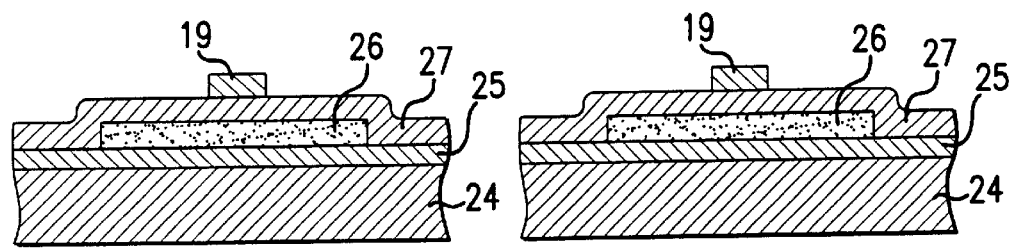

Next, as shown in FIG. 7B, the gate insulation film 27 comprising a silicon oxide film having a thickness of about 120 nm is formed on the surface of the polycrystalline silicon film 26 and the base insulation film 25 by the ECR-CVD process. Then, a tantalum film having a thickness of about 600 to 800 nm is deposited over the entire surface by the sputtering process, and patterned to form the gate electrode 19 (gate electrode forming step). In the above steps, the same processing is carried out on both the N-channel TFT side and the P-channel TFT side.

Figure 7C:
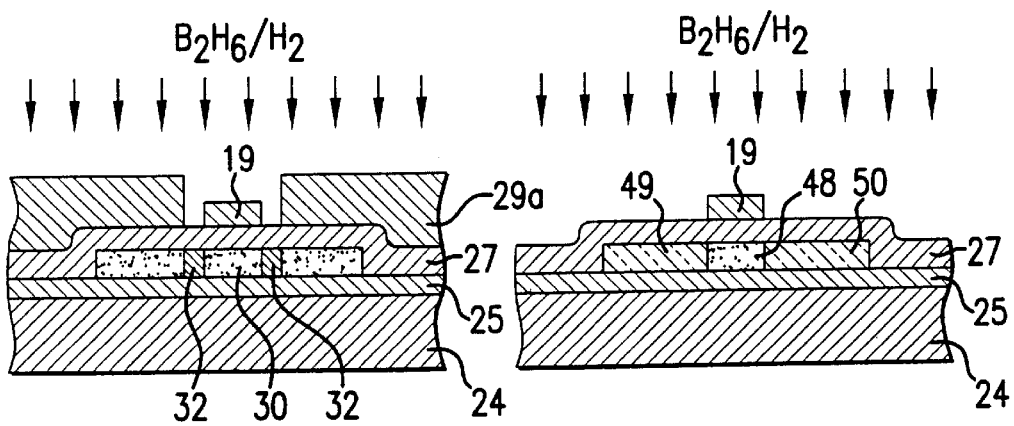
Figure 7D:
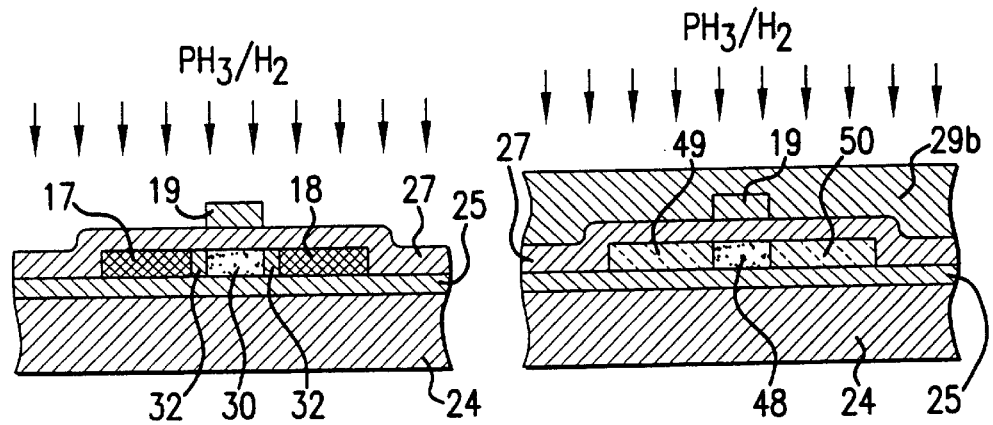

Next, as shown in FIG. 7C, a photoresist pattern 29a having openings formed in regions where the P-type impurity-diffused regions on the N-channel TFT side are formed and the entire region on the P-channel TFT side is formed, followed by ion doping with $B_2H6/H_2$. As a result, on the N-channel TFT side, the P-type impurity-diffused regions 32 are formed by the sides of the channel region 30 directly below the gate electrode 19 by ion implantation using the photoresist pattern 29a and the gate electrode 19 as a mask material (third region forming step). On the other hand, on the P-channel TFT side, a source region 49 (first region) and a drain region 50 (second region) are formed to hold the channel region 48 therebetween directly below the gate electrode by ion implantation using the gate electrode 19 as a mask. In this way, the P-type impurity-diffused regions 32 of the N-channel TFT and the source and drain regions 49 and 50 of the P-channel TFT can be simultaneously formed. In ion doping, the dosage is, for example, about 1 to $10 \times 10^{15}$ atoms/cm$^2$.

After the photoresist pattern 29a is then removed, a photoresist pattern 29b is formed to cover the entire region on the P-channel TFT side, followed by ion doping with $PH_3/H_2$ using the photoresist pattern 29b as a mask. As a result, ions are is implanted on the P-channel TFT side, and the source region 17 and the drain region 18 which are N-type impurity-diffused regions are formed on the N-channel TFT side (first and second region forming step). In ion doping, although the dosage may be about 1 to $10 \times 10^{15}$ atoms/cm$^2$, it is set to a value smaller than the dosage of $B_2H_6/H_2$ in the ion doping step shown in FIG. 7C. At this time, on the N-channel TFT side, both P-type impurities and N-type impurities are introduced into the regions 32 between the channel region 30 and the source and drain regions 17 and 18, but the above described set value for the dosage allows the regions 32 to remain the P-type.

Thereafter, the layer insulation film, the contact holes and the source and drain electrodes may be formed in turn by the same method of manufacturing described with respect to the first embodiment. In the method of this embodiment, after the P-type impurity-diffused regions 32 of the N-channel TFT and the source and drain regions 49 and 50 of the P-channel TFT have been formed, the source and drain regions 17 and 18 of the N-channel TFT are formed. However, conversely, the P-type impurity-diffused regions 32 of the N-channel TFT and the source and drain regions 49 and 50 of the P-channel TFT may be formed after the source and drain regions 17 and 18 of the N-channel TFT are formed (the order shown in FIGS. 7C and 7D may be reversed).

In the case of a CMOS-TFT, since the use of the method of this embodiment permits simultaneous formation of the P-type impurity-diffused regions 32 of the N-channel TFT and the source and drain regions 49 and 50 of the P-channel TFT in a photolithographic step and P-type ion implantation step, it is possible to manufacture a thin film transistor having impurity-diffused regions for preventing characteristic deterioration without increasing the number of the steps.

In the thin film transistor 31 of this embodiment, as a result of flow of the generated holes into the P-type impurity-diffused regions 32, the amount of the holes injected into the source region 17 is significantly decreased, thereby significantly decreasing the characteristic deterioration whereby the Vgs-Ids characteristic curve is shifted to the depletion side. Namely, the same effect as the first embodiment can be exhibited.

Figure 8A:
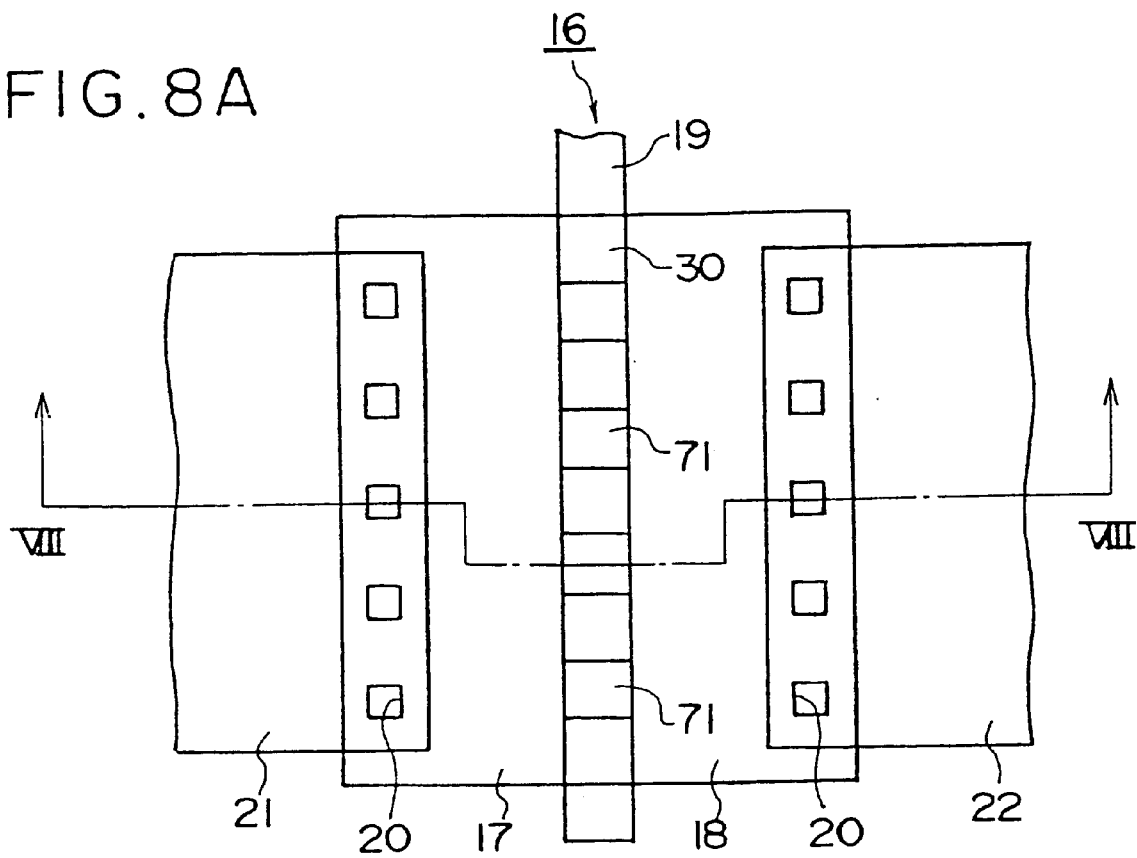
FIGS. 8A and 8B are drawings showing a thin film transistor in accordance with another embodiment of the present invention in which a p-type impurity diffused region has another shape.
Figure 8B:
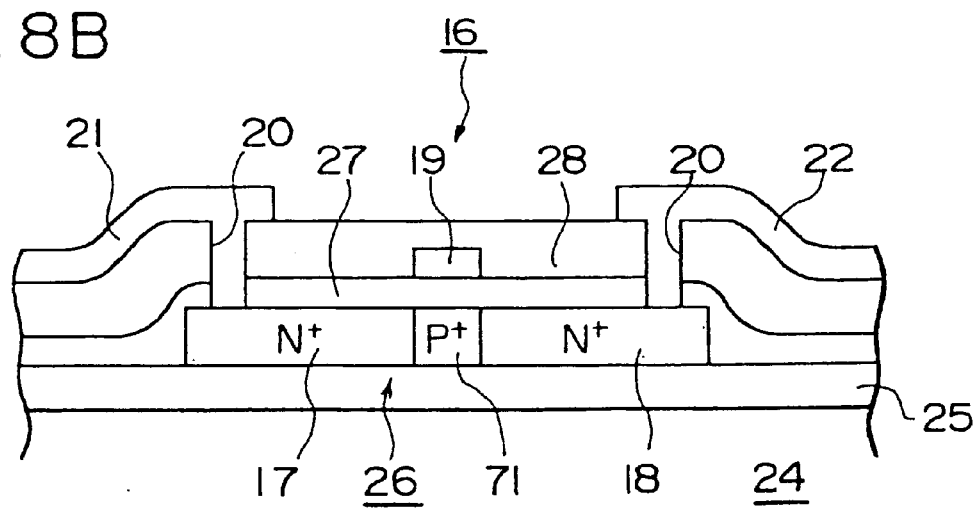
Figure 9A:
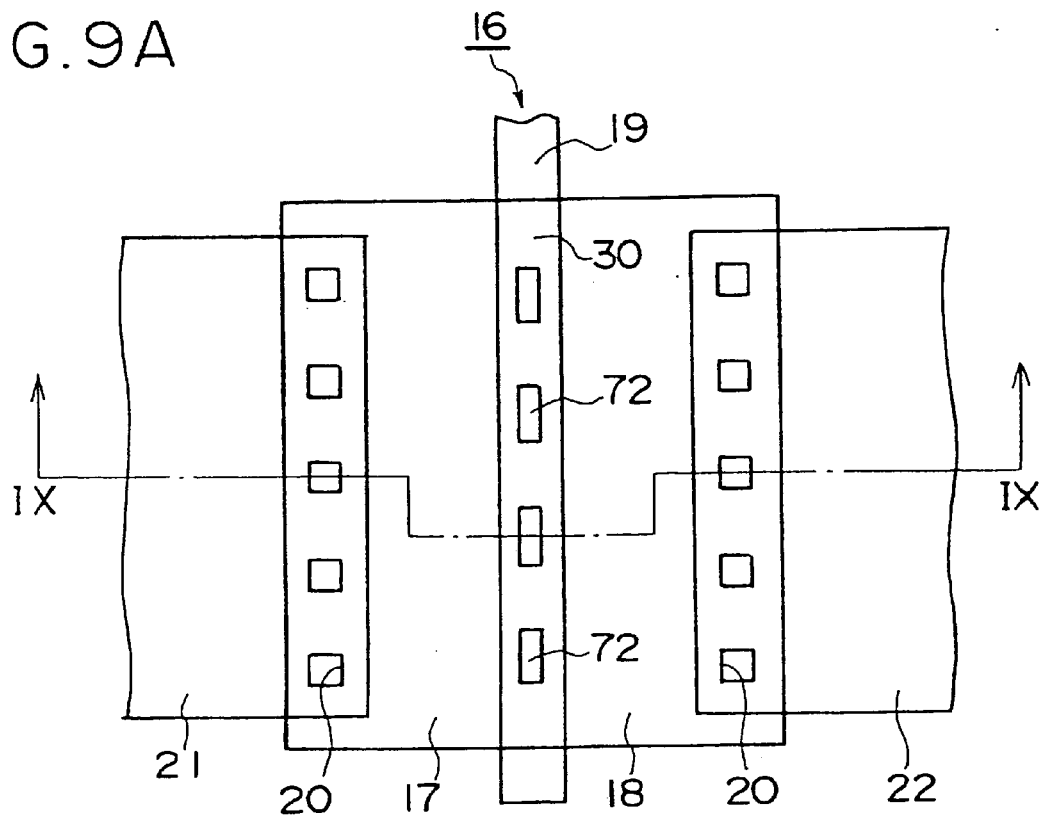
FIGS. 9A and 9B are drawings showing a thin film transistor in accordance with a further embodiment of the present invention in which a P-type impurity diffused region has still another shape.
Figure 9B:
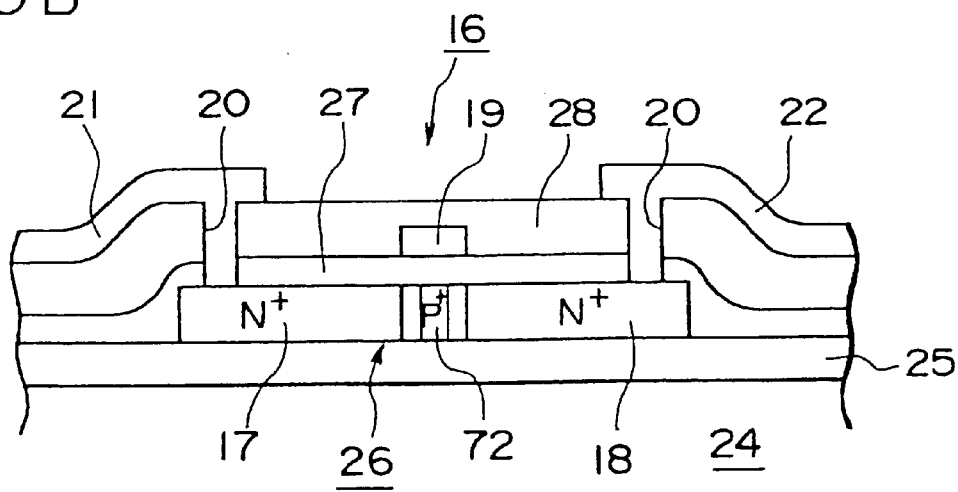

Although, in the first and second embodiments, an example is described in which the P-type impurity-diffused regions are formed to project outward from the channel region directly below the gate electrode, for example, a structure may be used in which the P-type impurity-diffused regions 71 do not project to the source and drain regions 17 and 18 from the channel region 30, as shown in FIGS. 8A and FIG. 8B, which is a sectional view taken along line VIII—VIII in FIG. 8A, or in which the P-type impurity-diffused regions 72 are formed in portions of the channel region 30 in the lengthwise direction of the channel, as shown in FIGS. 9A and 9B, which is a sectional view taken along line IX—IX in FIG. 9A. In FIGS. 8A to 9B, the components common to those shown in FIGS. 1A and 1B, and FIGS. 4A and 4B are denoted by the same reference numerals.

Although, in the thin film transistors of the first and second embodiments, the P-type impurity-diffused regions are provided on the source region side, the P-type impurity-diffused regions are not necessarily provided on the source region side because holes are strictly generated in the vicinity of the drain region, and the P-type impurity-diffused regions may be provided at least on the drain region side.

A third embodiment of the present invention will be described below with reference to FIGS. 10A and 10B.

Figure 10A:
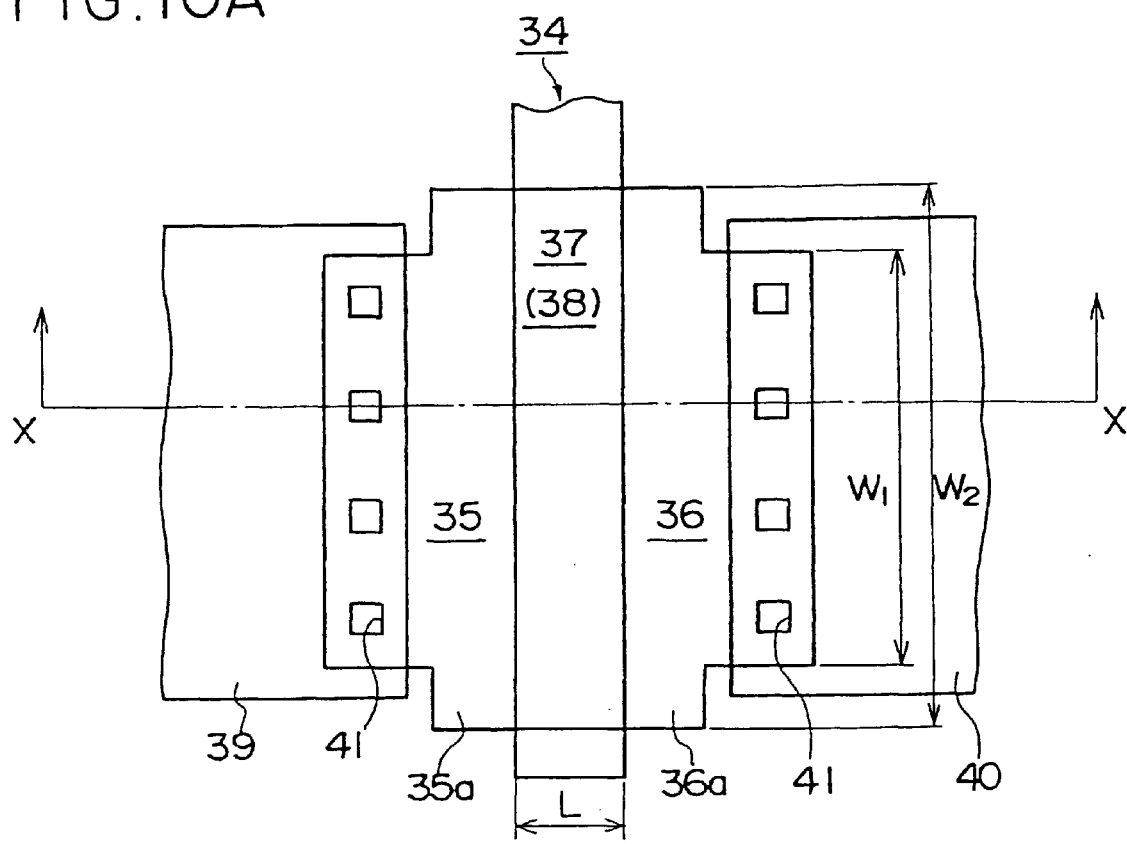
FIGS. 10A and 10B are drawings showing a thin film transistor in accordance with a third embodiment of the present invention.
Figure 10B:
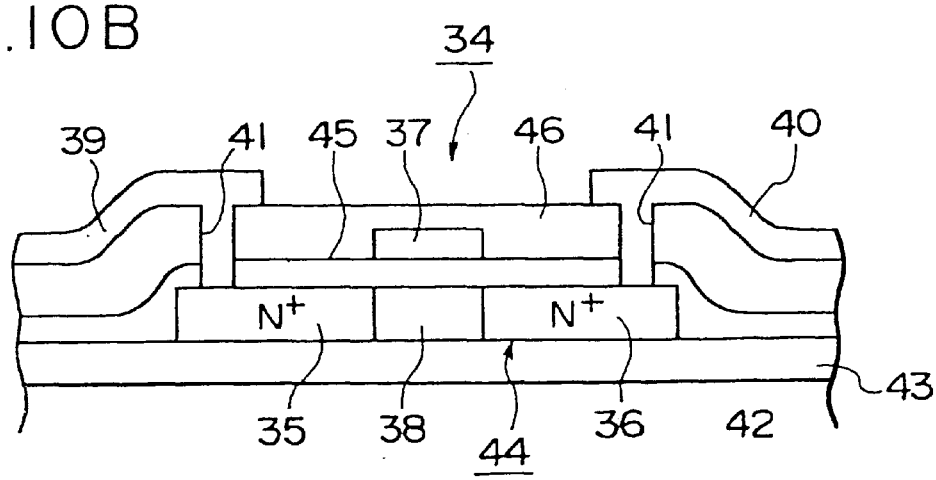

FIGS. 10A and 10B are drawings showing a thin film transistor 34 of this embodiment. Although the thin film transistor of each of the first and second embodiments comprises the P-type impurity-diffused regions, the thin film transistor 34 of this embodiment does not comprise the P-type impurity-diffused regions, but comprises source and drain regions and a channel region having a modified plane shape.

FIG. 10A is a plan view of the thin film transistor 34 of this embodiment. As shown in this drawing, the thin film transistor 34 comprises a source region 35 and a drain region 36, both of which are N-type impurity-diffused regions, a gate electrode 37 and a channel region 38 formed directly below the gate electrode 37. The ends of the source and drain regions 35 and 36, on the sides thereof opposite to the gate electrode 37, i.e., on the sides connected to a source electrode 39 and a drain electrode 40, are narrow, and the portions on the sides adjacent to the gate electrode 37 are projected outward (in the longitudinal direction of the drawing) by about 10 μm on either side in the widthwise direction to form projecting portions 35a and 36a (carrier injection regions). In this embodiment, for example, the channel length L is about 100 μm, the width W2 (minimum width) on the narrow sides of the source and drain regions is about 100 μm, and the width W2 of the channel region is about 20 μm larger than the width W1 of the narrow portions. The source region 35 and the drain region 36 are connected to the source electrode 39 and the drain electrode 40, respectively, through a plurality of contact holes 41.

FIG. 10B is a sectional view taken along line X—X in FIG. 10A. As shown in this view, on a glass substrate 42 are formed in turn a base insulation film 43 comprising a silicon oxide film, and a polycrystalline silicon thin film 44 which constitutes the source and drain regions 35 and 36 and the channel region 38. The gate electrode 37 comprising a tantalum film through a gate insulation film 45 is formed on these films. On the gate electrode 37 are formed a layer insulation film 46 comprising a silicon oxide film, the contact holes 41 which pass through the layer insulation film 46 and communicate with the source region 35 and the drain region 36, and the source electrode 39 and the drain electrode 40.

The mechanism of movement of carriers (electrons and holes) generally includes drift and diffusion. The drift represents the flow of carriers moved by an electric field, and the diffusion represents the flow of carriers moved by a concentration gradation. In the thin film transistor 34 of this embodiment, therefore, the flow of the holes generated in vicinity of the drain region 36 includes a component flowing to the drain region 35 due to the drift, and a component flowing in any direction due to the diffusion, and thus a part of the diffusion component flows to the projecting portions 35a and 36a. On the other hand, a region which actually functions as a transistor by the electric field generated by applying a voltage from the source and drain electrode 39 and 40 is the narrow region of the source and drain regions 35 and 36 and the channel region 38. Therefore, the holes flowing into the projecting portions 35a and 36a do to affect the transistor characteristics, and the ratio of the holes effectively injected into the source region 35 is consequently decreased, thereby decreasing the characteristic deterioration, as compared with a conventional thin film transistor.

A fourth embodiment of the present invention will be described below with reference to FIGS. 11A and 11B.

Figure 11A:
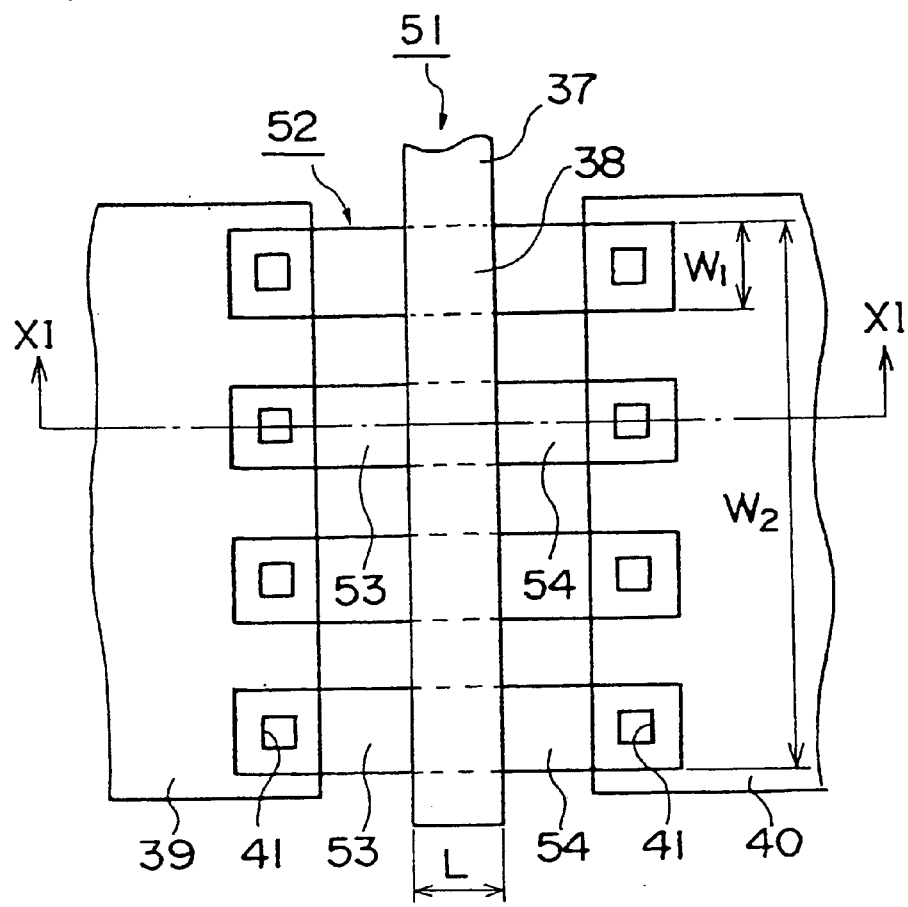
FIGS. 11A and 11B are drawings showing a thin film transistor in accordance with a fourth embodiment of the present invention.
Figure 11B:
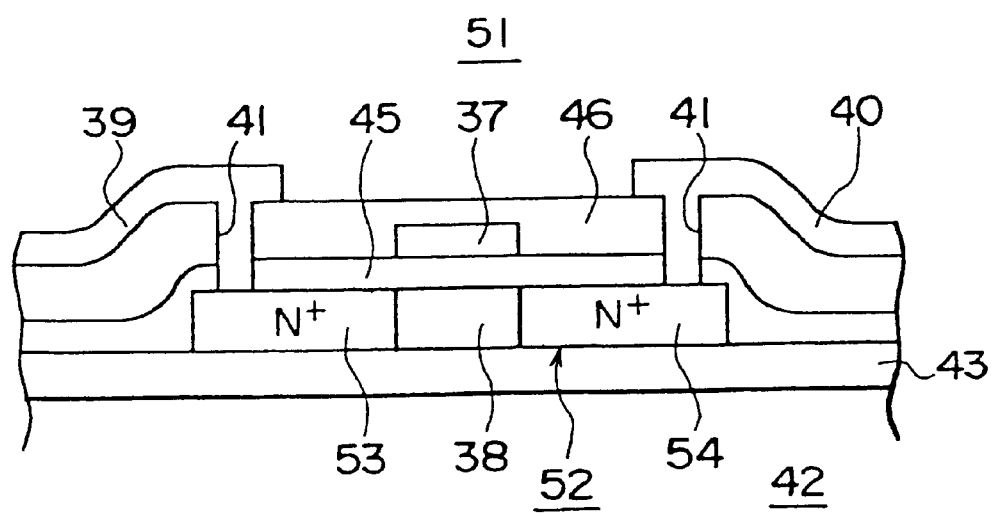

FIGS. 11A and 11B are drawings showing a thin film transistor 51 of this embodiment. The thin film transistor 51 of this embodiment has a form in which no P-type impurity-diffused region is formed, as in the third embodiment, and a plurality of transistors having a small channel width are connected in parallel. In FIGS. 11A and 11B, components common to those shown in FIGS. 10A and 10B are denoted by the same reference numerals.

FIG. 11A is a plan view of the thin film transistor 51 of this embodiment. As shown in this view, the thin film transistor 51 comprises a plurality (in this embodiment, four) of polycrystalline silicon thin films which are formed to cross a single gate electrode 37. In each of the polycrystalline silicon thin films 52, a source region 53 (first region) and a drain region 54 (second region) which are N-type impurity-diffused regions are formed to hold the channel region 38 below the gate electrode 37. In the source region 53 and the drain region 54 of each of the polycrystalline silicon thin films 52 are formed the contact holes 41, the source regions 53 and the drain regions 54 are connected to a common source electrode 39 and drain electrode 40, respectively. In this embodiment, as an example of dimensions, the channel length L is 5 μm, the width W1 of each channel region 38 is 10 μm, and the dimension W2 between the outermost sides of the plurality of polycrystalline silicon thin films 52 is 270 μm. W1 is preferably 10 μm or less, and W2 is preferably 50 μm or more.

FIG. 11B is a sectional view taken along line XI—XI in FIG. 11A. As shown in this view, on the glass substrate 42 are formed in turn the base insulation film 43 comprising a silicon oxide film, and a polycrystalline silicon thin film 52, which constitutes the source and drain regions 53 and 54 and the channel region 38. On these films is formed the gate electrode 37 comprising a tantalum film through the gate insulation film 45. On the gate electrode 37 are formed the layer insulation film 46 comprising a silicon oxide film, the contact holes 41, which pass through the layer insulation film 46 and communicate with the source region 53 and the drain region 54, and the source electrode 39 and the drain electrode 40.

As the channel width increases, the operation temperature of the TFT increases. This is because with a large channel width, the heat generated near the central portion of the channel is radiated only in the longitudinal direction, and does not radiate significantly in the transverse direction. Therefore, as the channel width increases, the reliability of the TFT deteriorates. From this viewpoint, in this embodiment, a plurality of transistors having a small width are connected in parallel so that heat can be efficiently radiated during operation, and sufficient reliability can be secured.

Figure 12:
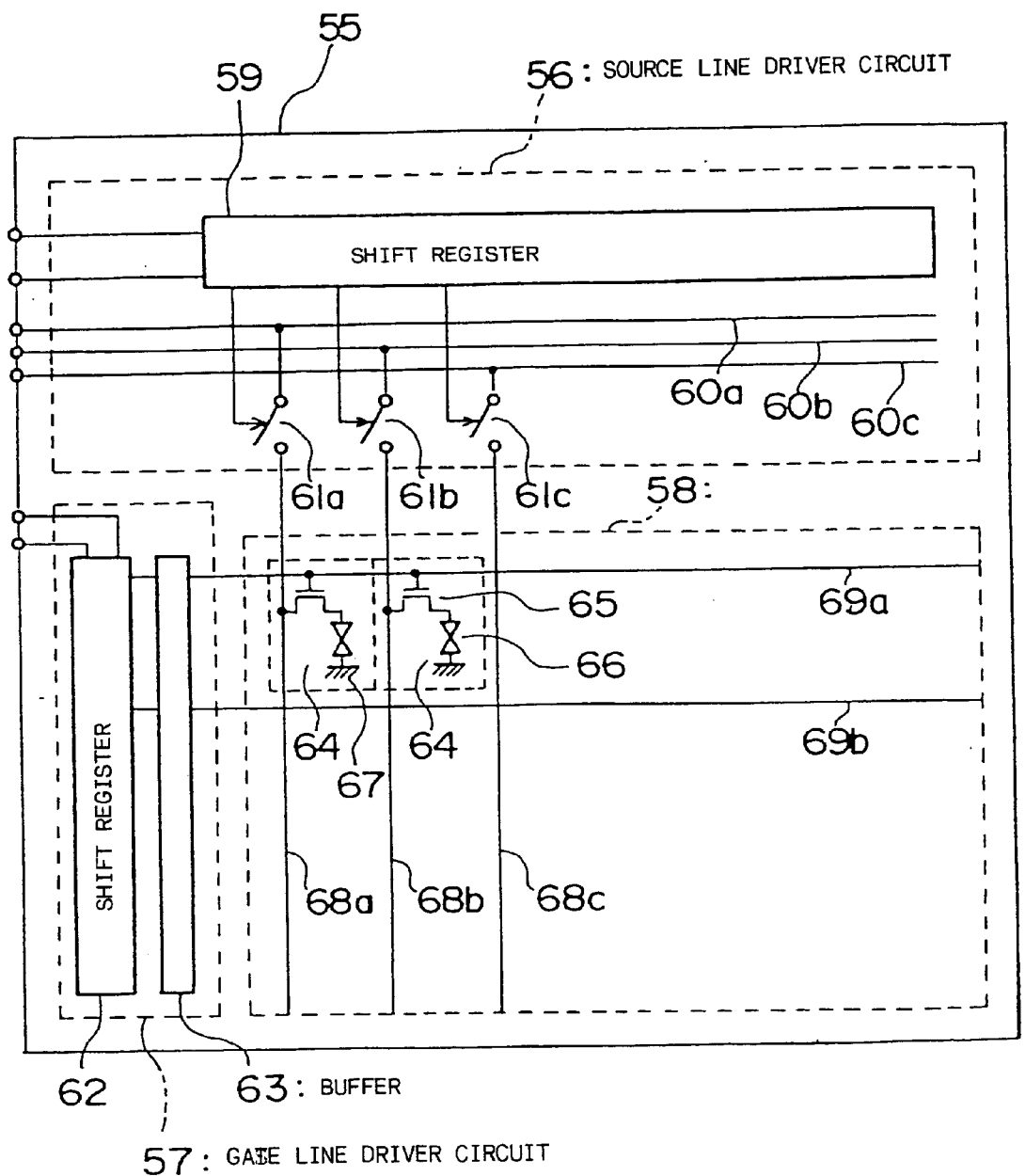
FIG. 12 a block diagram showing the configuration of a liquid crystal display device in accordance with a fifth embodiment of the present invention.

The fifth embodiment concerns a liquid crystal display device comprising a thin film transistor of the present invention, FIG. 12 is a block diagram showing the configuration of the liquid crystal display device.

As shown in FIG. 12, a liquid crystal display device 55 comprises built-in driver circuits, including a source line driver circuit 56, a gate line driver circuit 57, and a pixel matrix 58. The source line driver circuit 56 comprises a shift register 59, video signal buses 60a, 60b and 60c, analog switches 61a, 61b and 61c, etc. The gate line driver circuit 57 comprises a shift register 62, a buffer 63, etc., and both transistors which constitute these driver circuits 56 and 57 are CMOS type. On the other hand, the pixel matrix 58 comprises pixels 64 arranged in a matrix, and each of the pixels comprises a pixel transistor 65, a liquid crystal cell 66, and a counter electrode 67. Source lines 68a, 68b and 68c are extended from the source line driver circuit 56 to the respective pixel transistors 65 of the pixel matrix 58, and gate lines 69a and 69b are extended from the gate line driver circuit 57 to the respective transistors 65 of the pixel matrix 58.

In this liquid crystal display device, the thin film transistor of the present invention is applied to the circuit portion, including the source line driver circuit, the gate line driver circuit, etc., each of the analog switches and the pixel transistors or a portion thereof. This configuration permits the realization of a liquid crystal display device causing fewer operational errors in the circuits, and having good image quality.

The mechanism of occurrence of a leakage current (off current) in a polysilicon TFT will be described below.

Figure 13A:
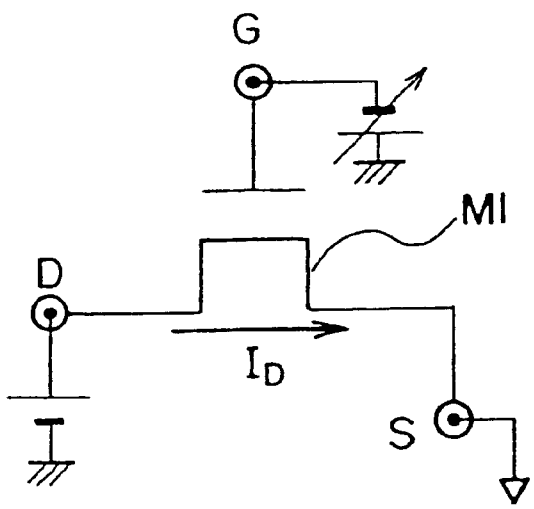
FIG. 13A is a drawing illustrating a leakage current (off current) of a TFT (n-type MOSFET)

As shown in FIG. 13A, a leakage current (off current) "ID" of polysilicon TFT (n-channel enhancement type MOSFET) M1 is defined as a current flowing when the gate (G) potential is 0 V, and a predetermined voltage is applied between the source (S) and the drain (D) (drain potential>source potential, drain potential>0).

Figure 14:
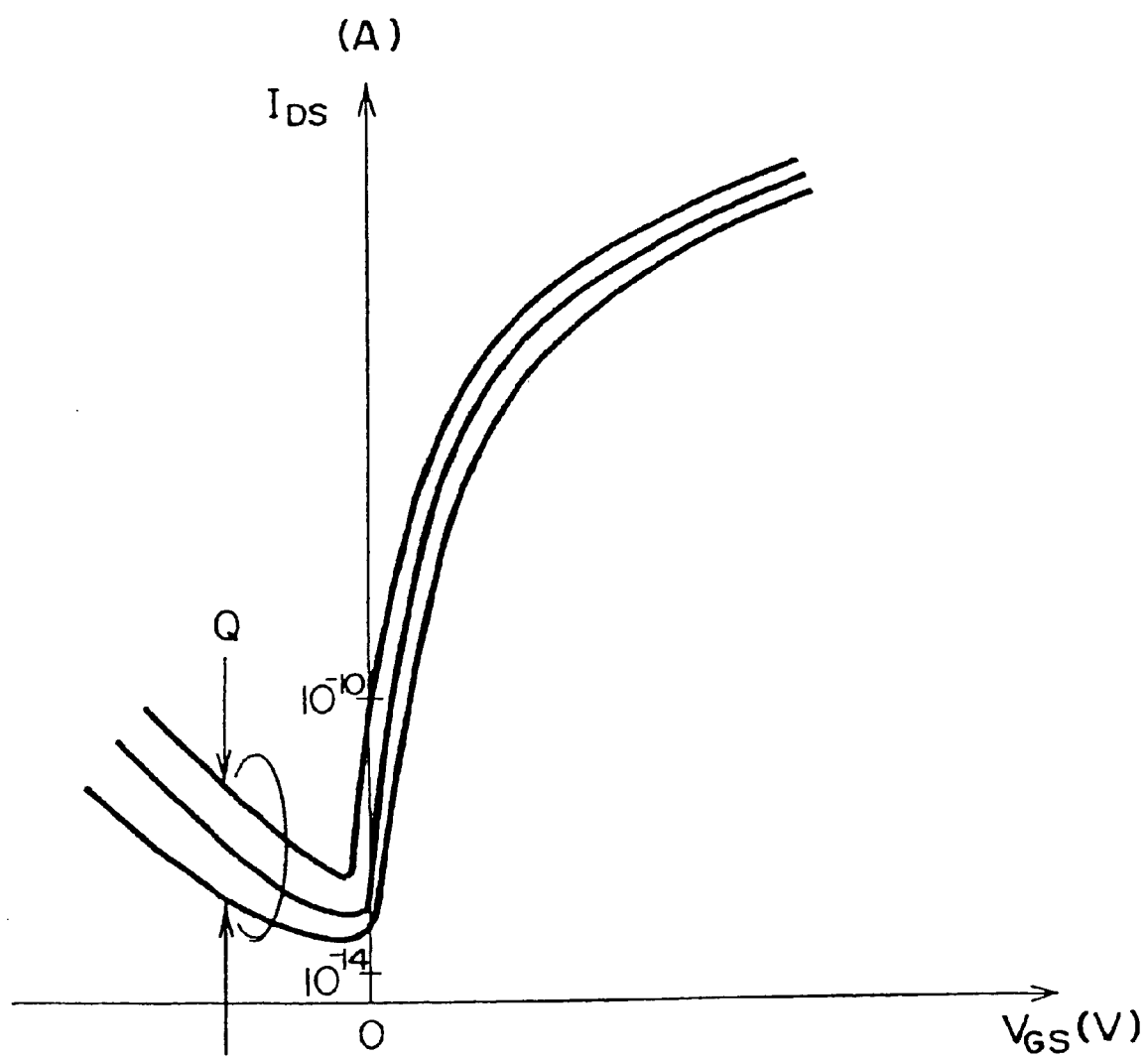
FIG. 14 is a drawing showing the voltage-current characteristics of a polysilicon TFT.

FIG. 14 shows an example of the relation between the gate-source voltage (VGS) and the drain-source current (IDS) in a polysilicon TFT formed by a low-temperature process. It is found that the leakage current (off current) is significantly large, and the variation width (Q) is also wide.

The reason why the leakage current (off current) of MOSFET comprising a polysilicon thin film is large, as compared with single crystal MOSFET, is due to the mechanism of leakage current peculiar to the polysilicon TFT. The consideration made by the inventors of this invention will be described with reference to FIG. 15.

Figure 15:
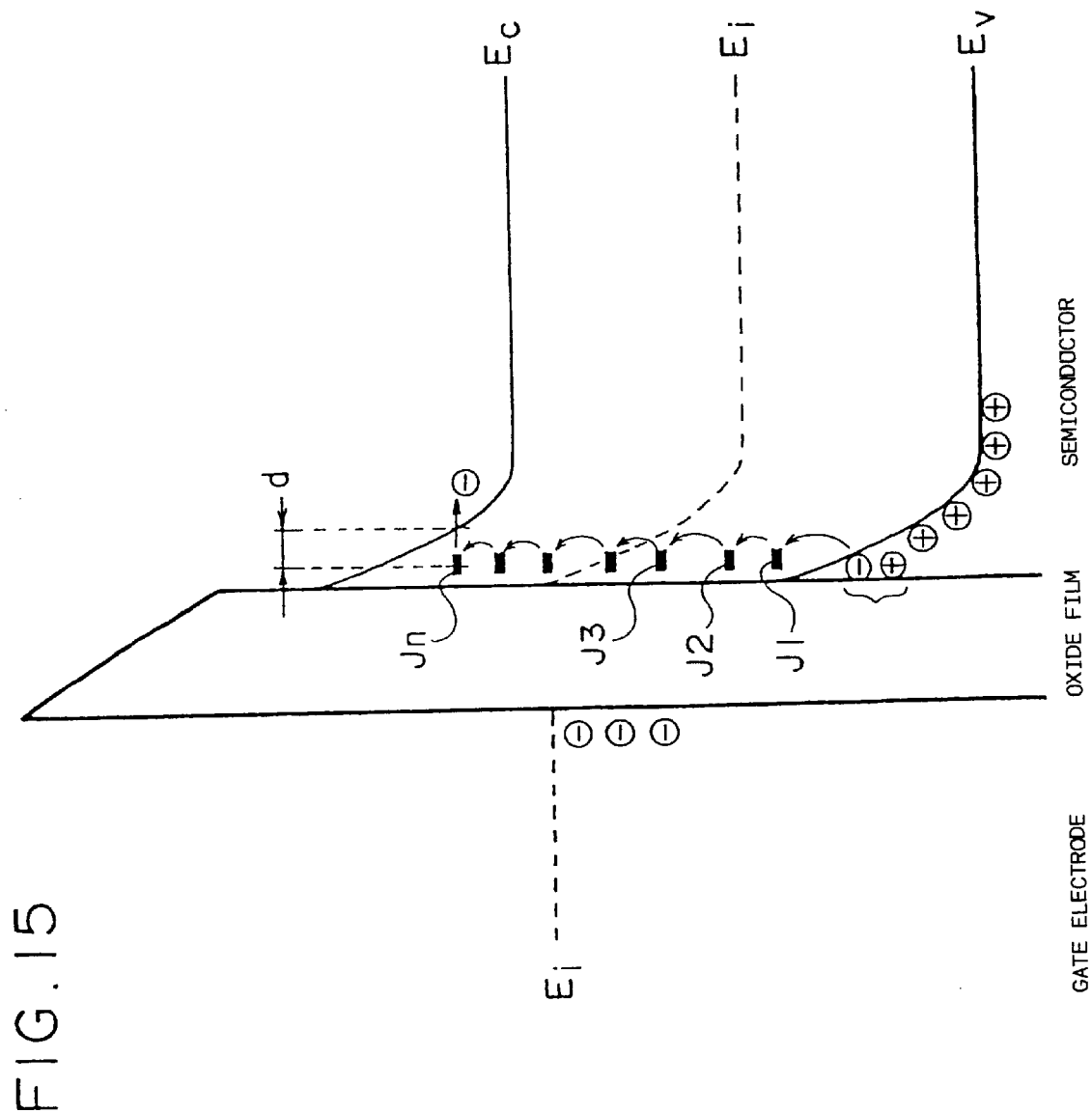
FIG. 15 is a drawing illustrating a leakage current (off current) of a polysilicon TFT.

FIG. 15 a diagram showing the energy bands of an N-type MOSFET in a storage state (the state wherein the gate is reversely biased). The energy band is inclined by the influence of the negative gate voltage. In the diagram, Ei indicates the intrinsic level, Ev indicates the upper limit level of the valence band, and Ec indicates the lower limit level of the conduction band.

For example, when electrons and positive holes are generated in the valence band by excitation due to light irradiation of polysilicon TFT and noise, the following phenomenon occurs.

Since various localized levels J1, J2, J3 to Jn are present in polysilicon, if there is an electric field, the newly generated electrons reach a localized level Jn through the localized levels J1, J2, J3, etc. At that higher level, if the width "d" of the forbidden band and the conduction band is as short as about the de Broglie wavelength due to the curves of the bands, electrons can pass through the forbidden band due to the tunnel effect and transfer to the conductor. As a result, the leakage current (off current) occurs.

In this way, "the electric field" in polysilicon MOSFET causes excitation through the localized levels of electrons or sharp curves of the bands. Namely, "the electric field" has an important effect on the leakage current properties of the TFT.

According to the investigation by the inventors, it was found that in MOSFET comprising a polysilicon island formed on a substrate 930, a strong electric field is applied to the portions where the outer edge of the polysilicon island overlaps with the gate electrode 22, i.e., the four edge portions (a) to (d), thereby causing an increase in the leakage current.

The reasons why the electric field at each of the four edge portions (a) to (d) is strong is due to the difference in height which occurs between the substrate 930 and the island due to the thickness of the island, and thus the thickness of the gate insulating film is decreased in these portions, and the electric field is easily concentrated because the edges of the island are at acute angles.

Figure 16:
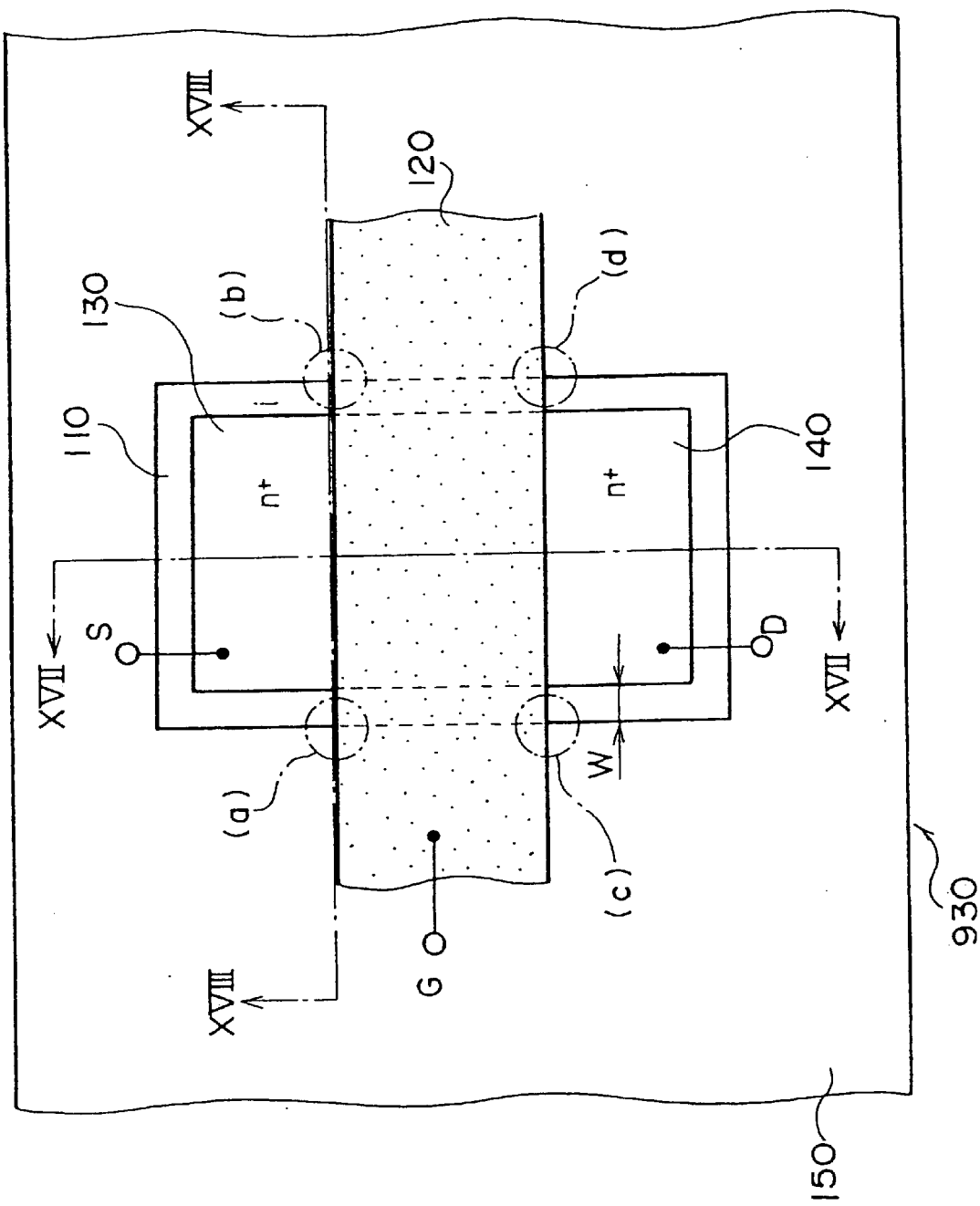
FIG. 16 is a plan view of a MOSFET in accordance with a sixth embodiment of the present invention.

FIG. 16 is a plan view of a MOSFET in accordance with a sixth embodiment of the present invention.

Figure 13B:
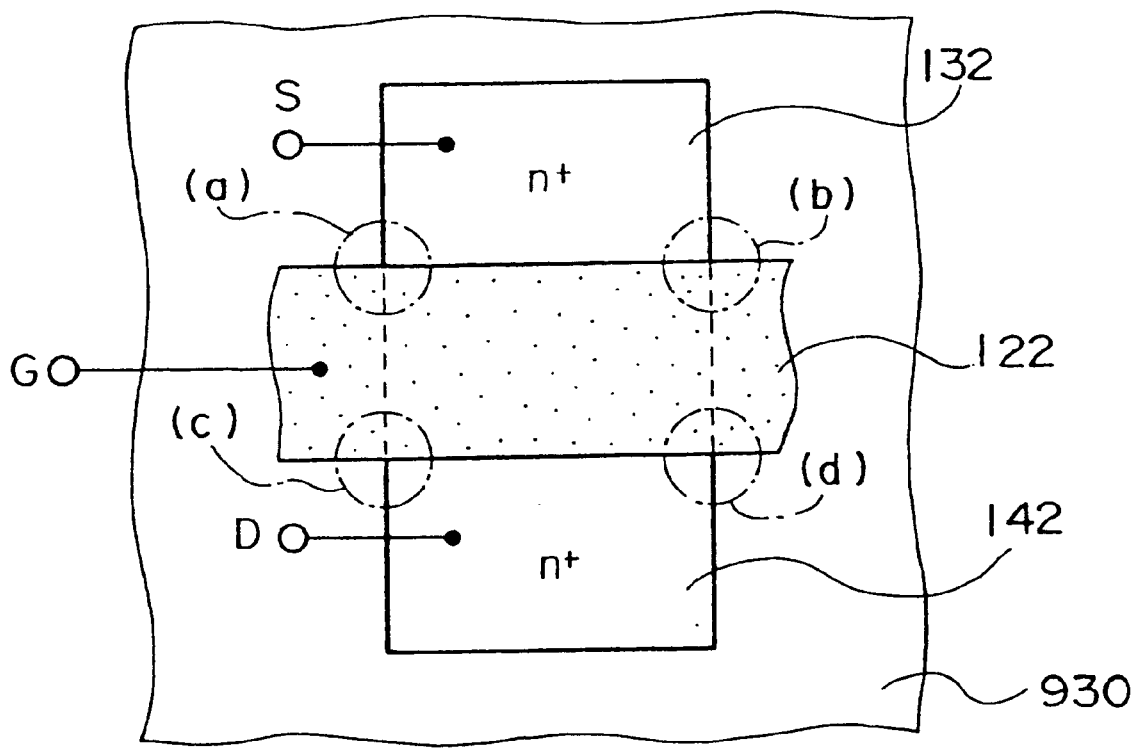
FIG. 13B is a drawing showing a plan structure of a TFT (n-type MOSFET)

This MOSFET is characterized in that an intrinsic layer (i layer) 110 is provided at the outer edge of a polysilicon island. Namely, unlike FIG. 13B, the outer edge (periphery) of the polysilicon island does not coincide with the outer edges of a source layer 130 and a drain layer 140, the source layer 130 and the drain layer 140 being provided inside the island. In FIG. 16, reference numeral 120 denotes a gate electrode layer, and reference numeral 930 denotes an insulating substrate.

Figure 17:
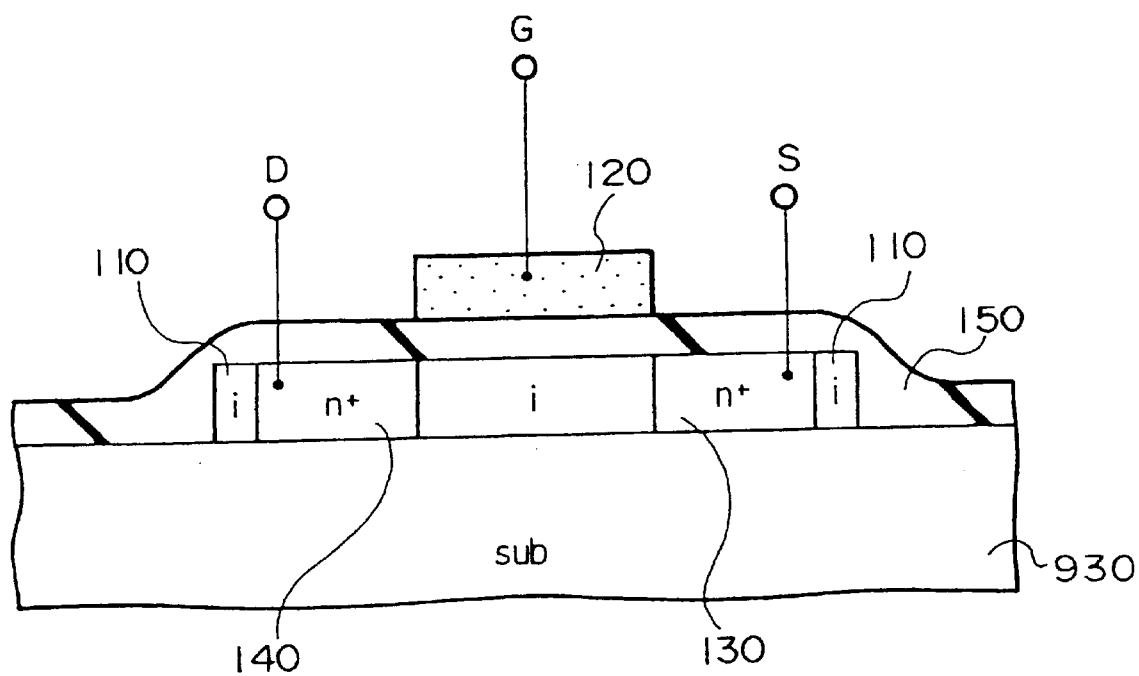
FIG. 17 is a sectional view of a MOSFET taken along line XVII—XVII of FIG. 16.
Figure 18A:
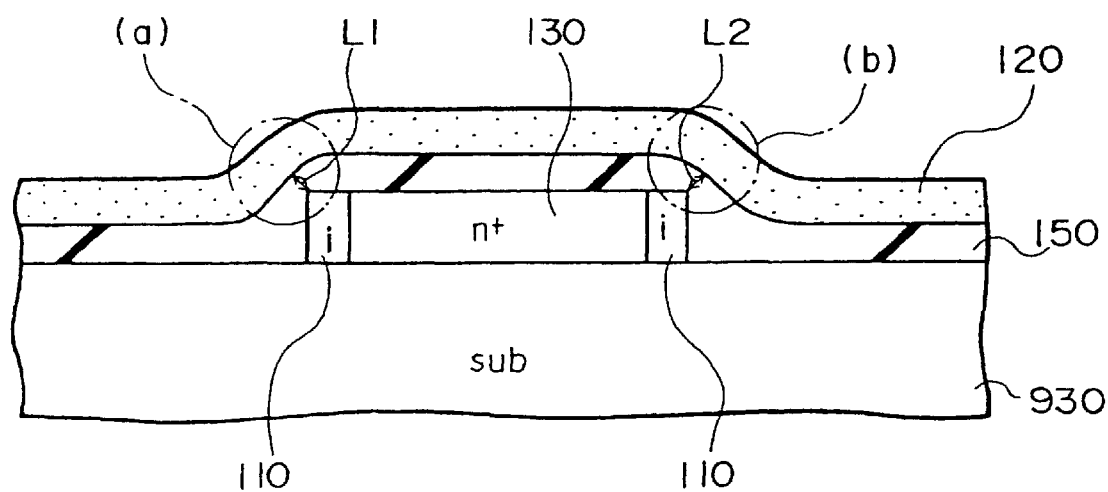
FIG. 18A is a sectional view of a MOSFET taken along line XVIII—XVIII of FIG. 16.

FIG. 17 is a sectional view of a device taken along line VXII—VXII in FIG. 16, and FIG. 18A is a sectional view a device taken along line VXIII—VXIII in FIG. 16. In FIGS. 17 and 18A, reference numeral 150 denotes a gate insulation film ($SiO_2$ film).

As shown in FIG. 18A, in the edge portions (a) and (b) of the polysilicon island, the thicknesses L1 and L2 of the gate insulation film are decreased due to the difference in level caused by the thickness of the island, as compared with the thickness of the other portions which are flat, and the electric field is therefore easily concentrated because the edges of the island are at an acute angle, thereby enhancing the electric field.

Figure 18B:
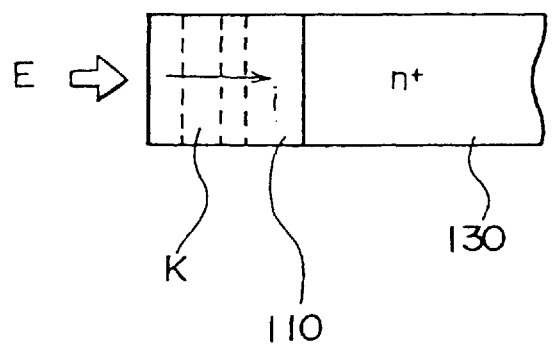
FIG. 18B is a drawing illustrating the effect of relieving an electric field.

However, in the structure shown in FIG. 18A, the electric field applied to the source layer 130 is relieved by the intrinsic layer (i layer) 110. Namely, as shown in FIG. 18B, when an electric field E is applied, a depletion layer extends in the intrinsic layer (i) layer 110 and absorbs the electric field. As a result, the electric field applied to the source layer 130 is decreased. As described above, since the electric field affects the occurrence of the leakage current (off current), the leakage current (off current) decreases as the electric field decreases, and variations thereof are also suppressed.

Figure 19:
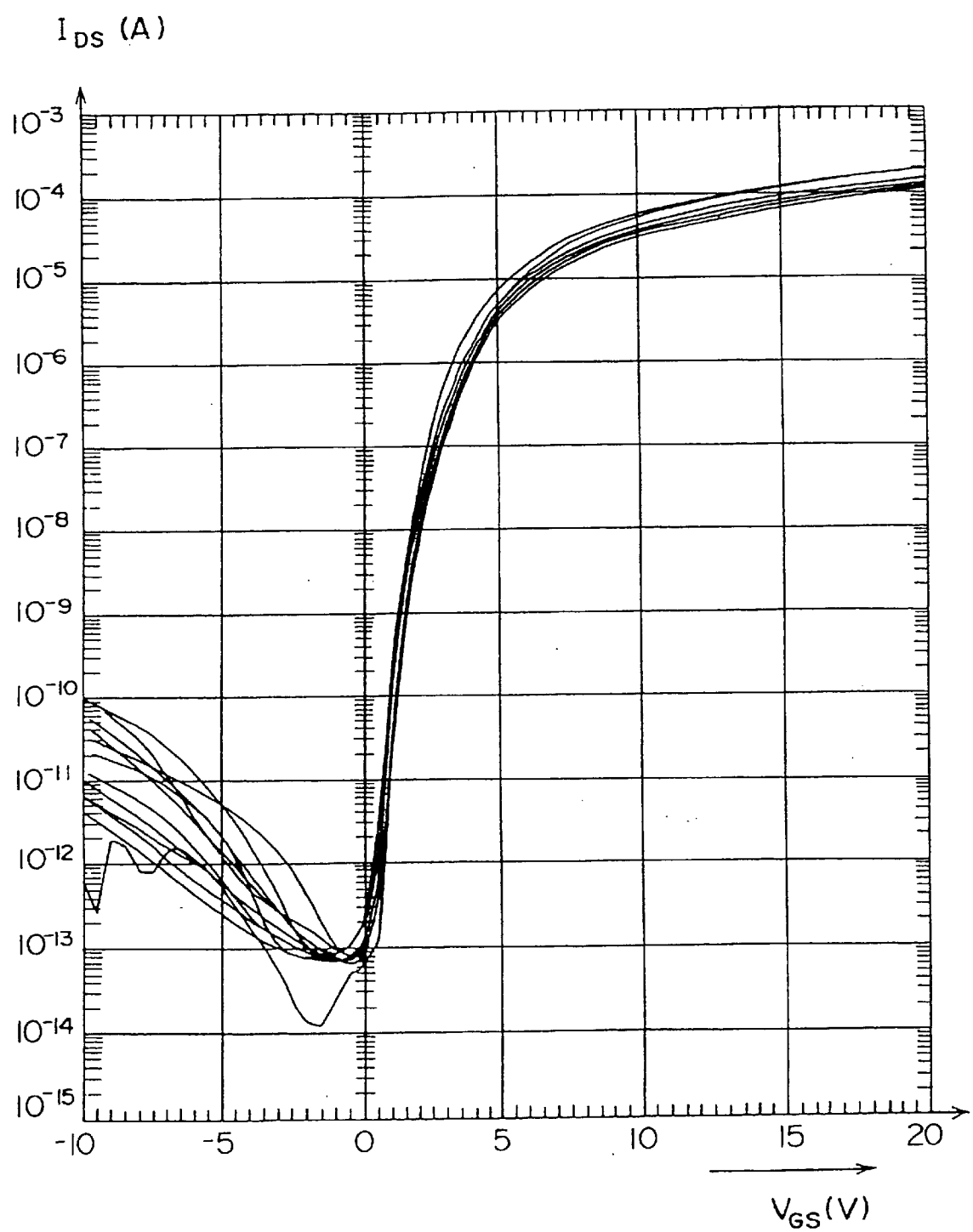
FIG. 19 is a drawing showing the relation between the gate-source voltage (VGS) and the drain-source current (IDS) in a comparative example.
Figure 20:
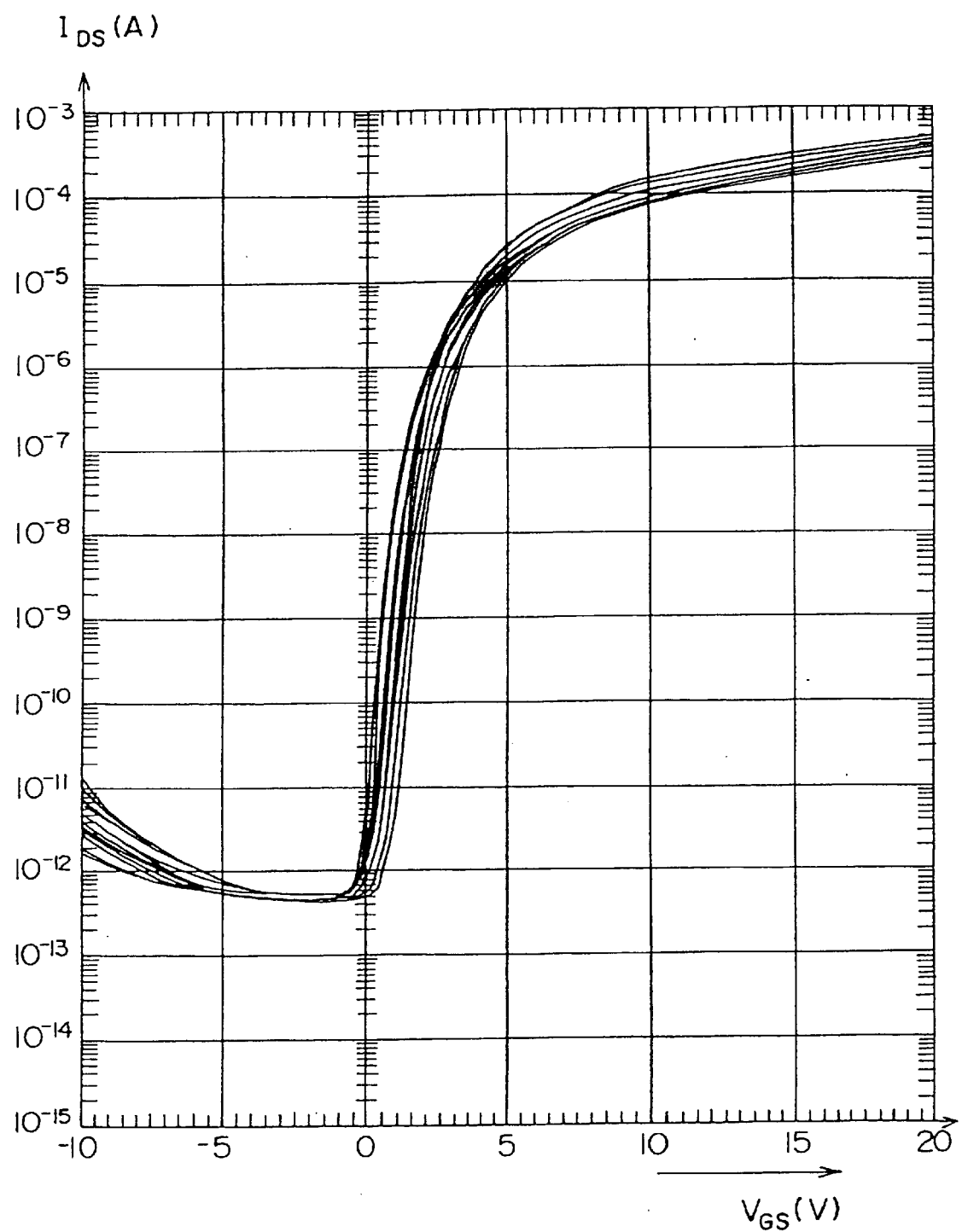
FIG. 20 is a drawing showing the relation between the gate-source voltage (VGS) and the drain-source current (IDS) in a MOSFET of the present invention shown in FIG. 16.

FIGS. 19 and 20 show the values of the drain-source current (IDS) against the gate-source voltage (VGS) of a polysilicon TFT (n-type MOSFET) formed by a low temperature process, which were measured by the inventors. FIG. 19 shows the case where the present invention was not applied, and FIG. 20 shows the case (the case of the structure shown in FIG. 16) where the present invention was applied. In both cases, the amount of the leakage current was measured for 12 samples.

In FIG. 19, the maximum IDS=$10^{-10}$ A when VGS=−10 V, while in the case of FIG. 20, the maximum IDS=$10^{-11}$ A under the same conditions, and the amount of the leakage current is decreased to $\frac{1}{10}$.

In the case of FIG. 19, the range of variations in IDS is of the order of "$10^{-11}$ to $10^{-13}$ (A)" when VGS=−10 V, while in the case of FIG. 20, the range of variations in IDS is the order of "$10^{-11}$ to $10^{-12}$ (A)" under the same conditions, and the variations are the range of decreased to $\frac{1}{10}$.

As described above, the configuration shown in FIG. 16 enables a decrease in the amount of the leakage current (off current), and suppression of the current variations.

Although, in FIG. 16, in consideration of the convenience of a mask pattern for forming the source layer and the drain layer, the intrinsic layer (i layer) 110 surrounds the polysilicon island, the intrinsic layer (i) layer may be basically provided in portions which overlap with the gate electrode layer 20, particularly the portions (a), (b), (c) and (d) shown in FIG. 16.

Although, in FIG. 16, the intrinsic layer (i layer) is included in both the source (S) and the drain (D) for the convenience of description, the intrinsic layer (i layer) may basically be included in the drain (D).

However, for example, in the case of a TFT of the pixel portion of a liquid crystal display device, the potential varies, and thus the source and drain cannot be specified. In such a case, a structure is required in which the intrinsic layer (i layer) is included in both two impurity layers which constitute the source (or drain).

Figure 21:
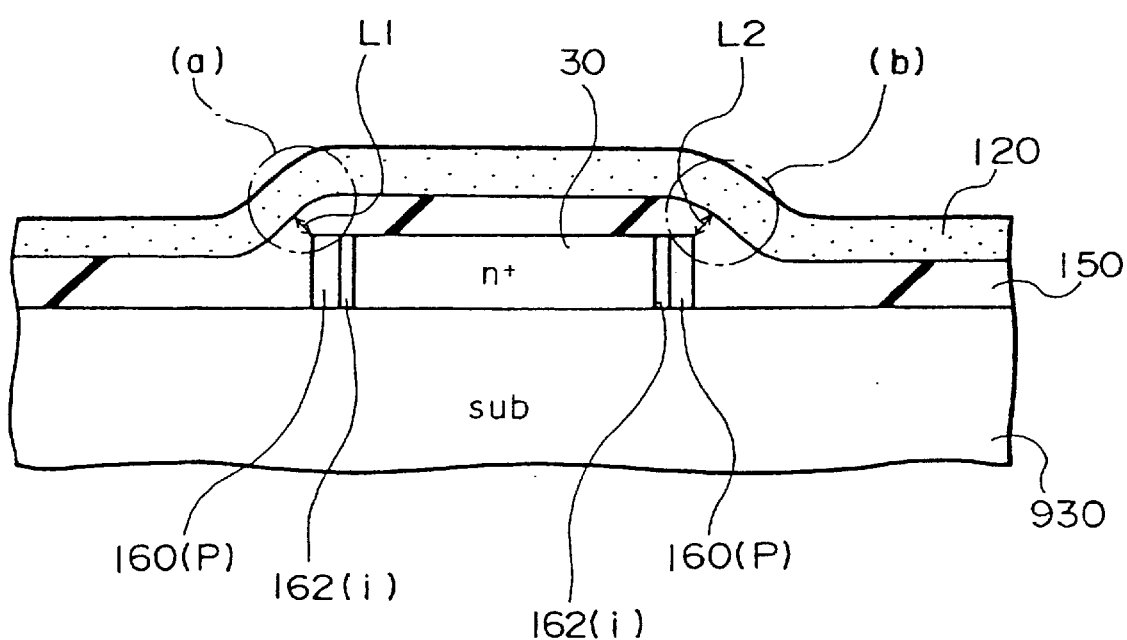
FIG. 21 is a sectional view (a sectional view taken along line XVIII—XVIII of FIG. 16) of a device in accordance with a seventh embodiment of the present invention.

FIG. 21 is a sectional view (a section view taken along line XVIII—XVIII in FIG. 16) of a device in accordance with the seventh embodiment of the present invention.

In this embodiment, a p layer 160 and an intrinsic layer (i layer) 162 are provided in portions (a) and (b) at the outer edge of a polysilicon island where an electric field is strong.

According to experiments performed by the inventors, in this case, the same effect described with respect to the previous embodiments can be obtained.

Figure 22:
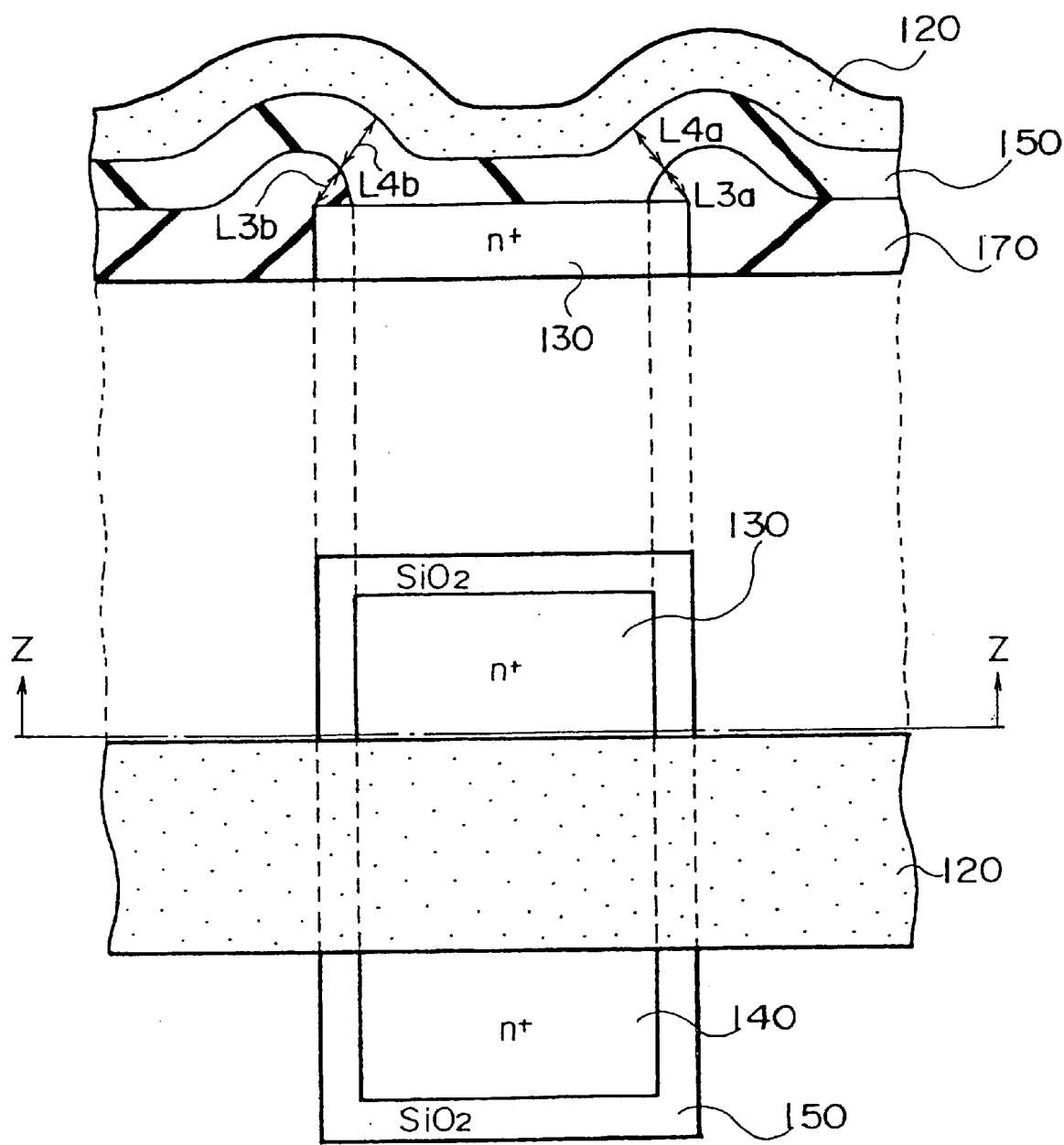
FIG. 22 is a drawing showing the sectional structure (upper side) and the plane structure (lower side) of a device in accordance with an eighth embodiment of the present invention.

FIG. 22 is a drawing showing a sectional structure (upper side) and a plan structure (lower side) of a device in accordance with the eighth embodiment of the present invention.

This embodiment is characterized in that an insulation film (SiO$_2$ film) 170 is provided to overlap with the outer edge of a polysilicon island to increase the thicknesses of the insulation film at the edge portions, thereby relieving the electric field.

As shown in the upper drawing of FIG. 22, at each of the edges of the polysilicon island, the insulation film (SiO$_2$ film) 170 (thicknesses L3$a$ and L3$b$) and a gate insulation film 150 (thicknesses L4$a$ and L4$b$) are overlapped with each other between the edge and a gate electrode layer 120. As a result, the electric field applied to an n$^+$ layer (source or drain) 130 is relieved.

Figure 23A:
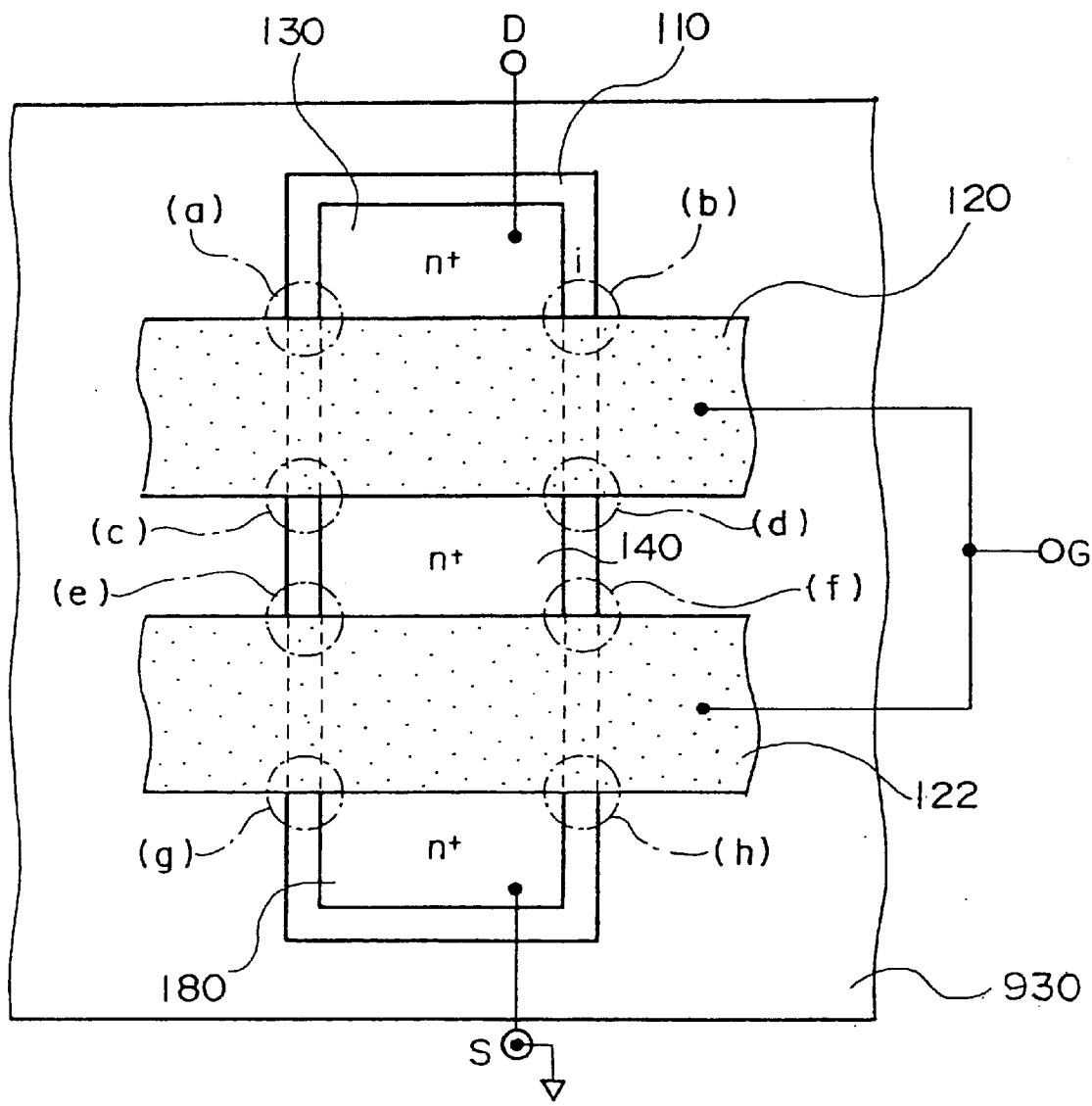
FIG. 23A is a drawing showing the plane structure of a device in accordance with a ninth embodiment of the present invention.
Figure 23B:
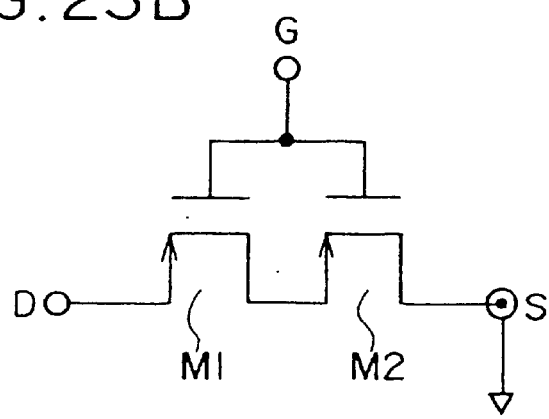
FIG. 23B is a drawing showing the equivalent circuit of the device shown in FIG. 23A.

FIG. 23A shows the plan structure of a device in accordance with a ninth embodiment of the present invention, and FIG. 23B shows the equivalent circuit thereof.

The present invention is characterized in that the structure shown in FIG. 16 was applied to dual gate type MOSFET.

The dual gate type MOSFET has a structure in which two MOS transistors M1 and M2 are connected in series, as shown in FIG. 23B. In FIG. 23A, reference numeral 120 denotes a first gate; reference numeral 22, a second gate; and reference numeral 180, a source layer.

When the electric field relieving structure comprising the intrinsic layer shown in FIG. 16 is employed for at least each of the portions (a) to (h) shown in FIG. 23A, the leakage current of each MOSFET is decreased.

When the ratio of reduction (the amount of leakage current after application of the present invention/the amount of leakage current before application) in the leakage current of one MOSFET is "F (<1)", the total ratio of reduction in the leakage current of two MOSFETs is "F×F", the amount of the leakage current is further decreased, as compared with the case of one MOSFET. Variations of the leakage current are also decreased.

Figure 24:
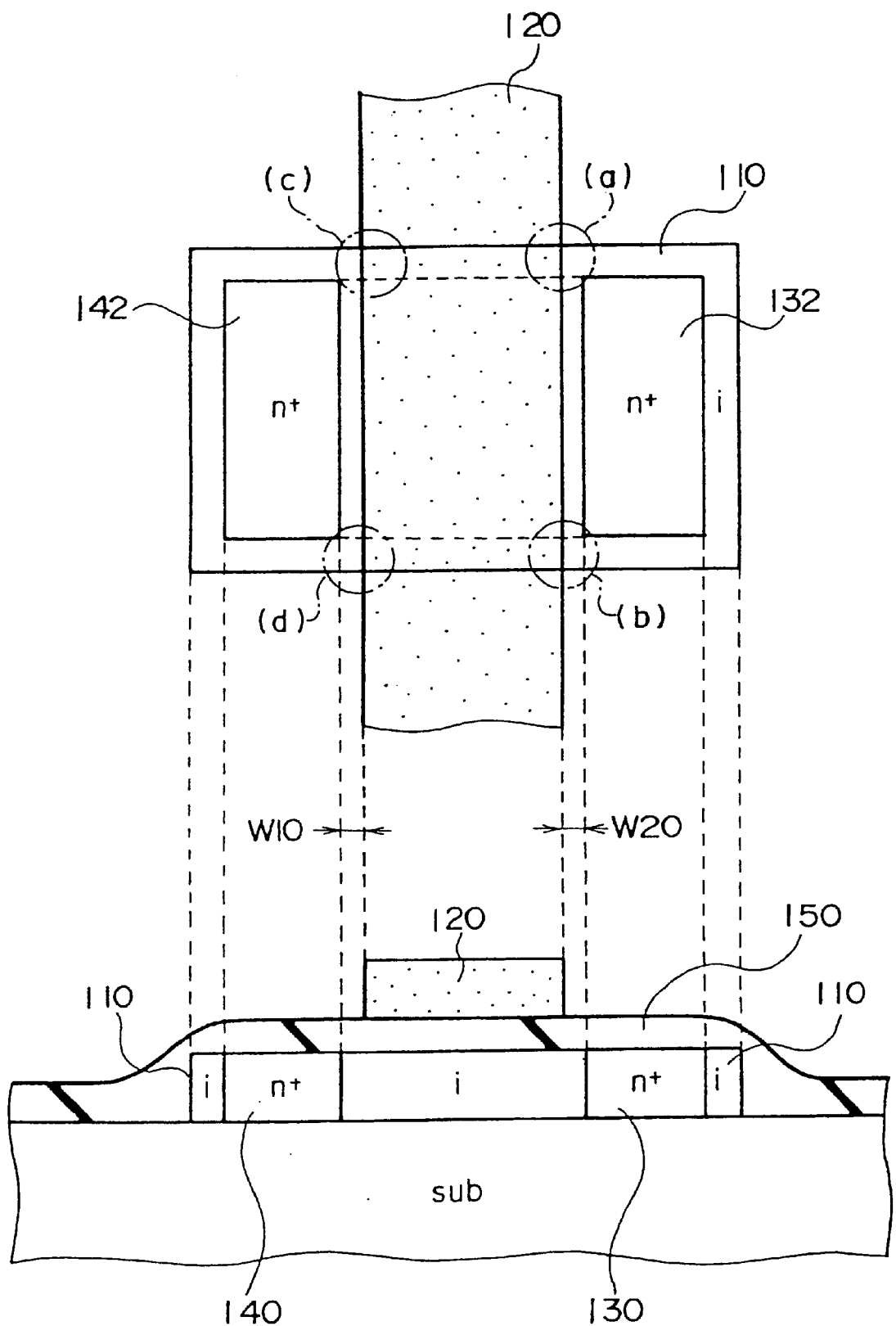
FIG. 24 is a drawing showing the sectional structure (upper side) and the plan structure (lower side) of a device in accordance with a tenth embodiment of the present invention.

FIG. 24 is a drawing showing the plan structure (upper side) and the sectional structure (lower side) of a device in accordance with a tenth embodiment of the present invention.

This embodiment is characterized in that the structure shown in FIG. 16 was applied to "so-called offset MOSFET".

The offset MOSFET is a transistor having a structure in which at least a drain layer is arranged to be offset to a gate electrode (namely, an offset is provided in the relative positional relation). In FIG. 24, not only a drain layer 142 but also a source layer 132 are offset.

The offset structure has no overlap of the gate and the drain, and is thus effective for decreasing the leakage current (off current). While with a large offset, the on current is decreased, and the threshold voltage is increased. Therefore, it is difficult to control the offset amount.

When the structure shown in FIG. 16 is applied to an offset structure MOS transistor, it is possible to effectively decrease the leakage current (off current) and suppress current variations, without significantly increasing the offset amount. This facilitates the guarantee of the on current and design.

For example, if an offset of 2 $\mu$m is required for decreasing the leakage current (off current) to a desired level in the case wherein the present invention is not applied, utilization of the structure of this embodiment makes sufficient an offset of, for example, 1 $\mu$m, thereby further facilitating the design.

An example of the method of manufacturing a CMOS structure TFT in which the structure shown in FIG. 16 is employed will be described below with reference to FIGS. 25 to 31.

Figure 25:
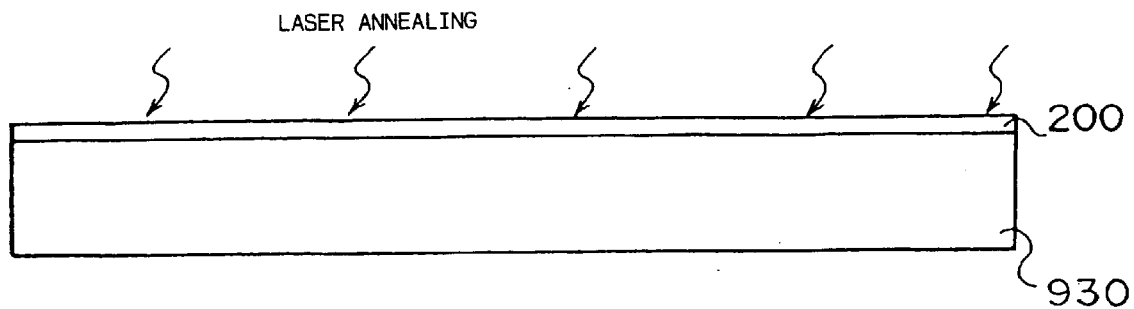
FIG. 25 is a drawing showing a first step for manufacturing a CMOS (TFT) of the present invention.

(Step 1) As shown in FIG. 25, an amorphous silicon thin film (or a polysilicon thin film) 200 deposited on a glass substrate by a LPCVD process is annealed by laser irradiation using an excimer laser to form a polysilicon thin film by recrysallization.

Figure 26:
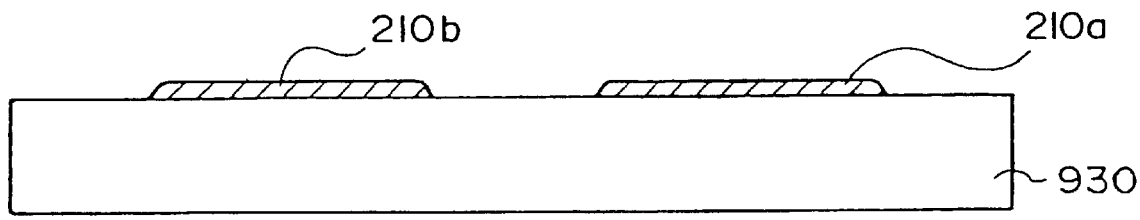
FIG. 26 is a drawing showing a second step for manufacturing a CMOS (TFT) of the present invention.

(Step 2) Then, as shown in FIG. 26, islands 210a and 210b are formed by patterning.

Figure 27:
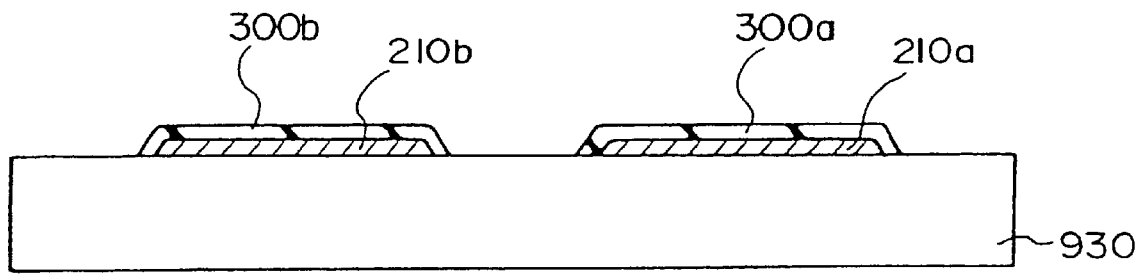
FIG. 27 is a drawing showing a third step for manufacturing a CMOS (TFT) of the present invention.

(Step 3) As shown in FIG. 27, gate insulation films 300a and 300b are formed to cover the islands 210a and 210b, respectively.

Figure 28:
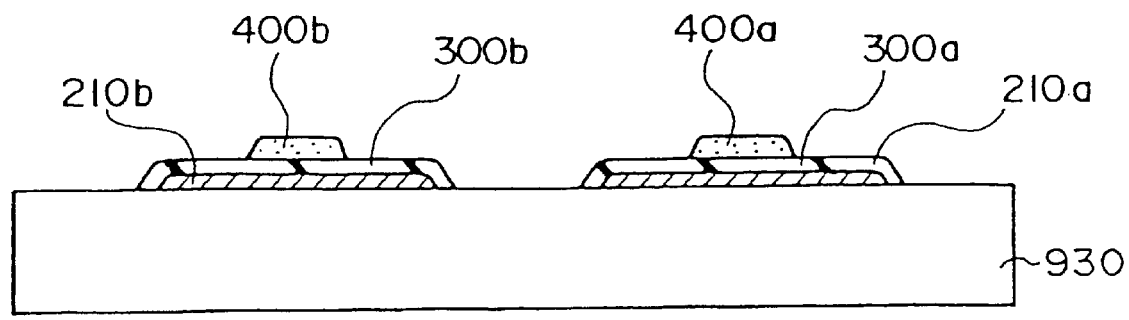
FIG. 28 is a drawing showing a fourth step for manufacturing a CMOS (TFT) of the present invention.

(Step 4) As shown in FIG. 28, gate electrodes 400a and 400b comprising Al, Cr, Ta or the like are formed.

Figure 29:
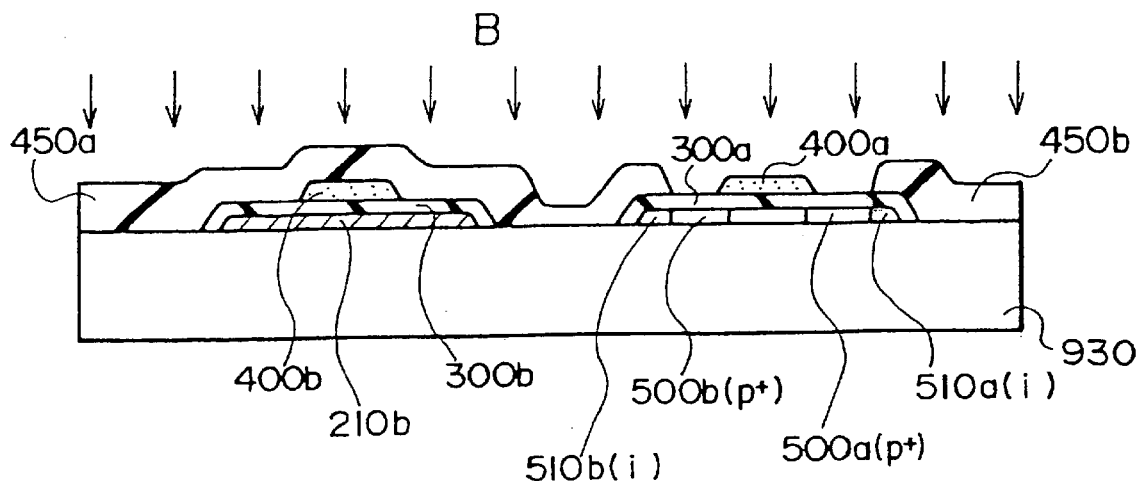
FIG. 29 is a drawing showing a fifth step for manufacturing a CMOS (TFT) of the present invention.

(Step 5) As shown in FIG. 29, mask layers 450a and 450b comprising polyimide or the like are formed, and ions of boron (B), for example, are implanted in a self alignment manner using the gate electrode 400a and the mask layers 450a and 450b as masks. As a result, p$^+$ layers 500a and 500b are formed. This is accompanied with the automatic formation of intrinsic layers 610a and 610b.

Figure 30:
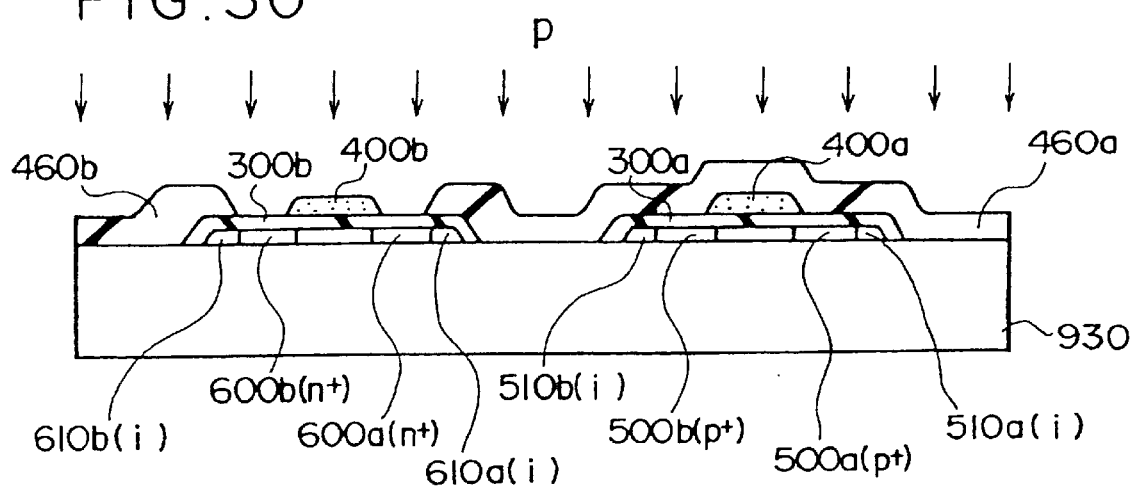
FIG. 30 is a drawing showing a sixth step for manufacturing a CMOS (TFT) of the present invention.

(Step 6) As shown in FIG. 30, mask layers 460a and 460b comprising polyimide or the like are formed, and ions of phosphorus (P), for example, are implanted in a self alignment manner using the gate electrode 400b and the mask layers 460a and 460b as masks. As a result, n$^+$ layers 600a and 600b are formed. This is accompanied with the automatic formation of intrinsic layers 610a and 610b.

Figure 31:
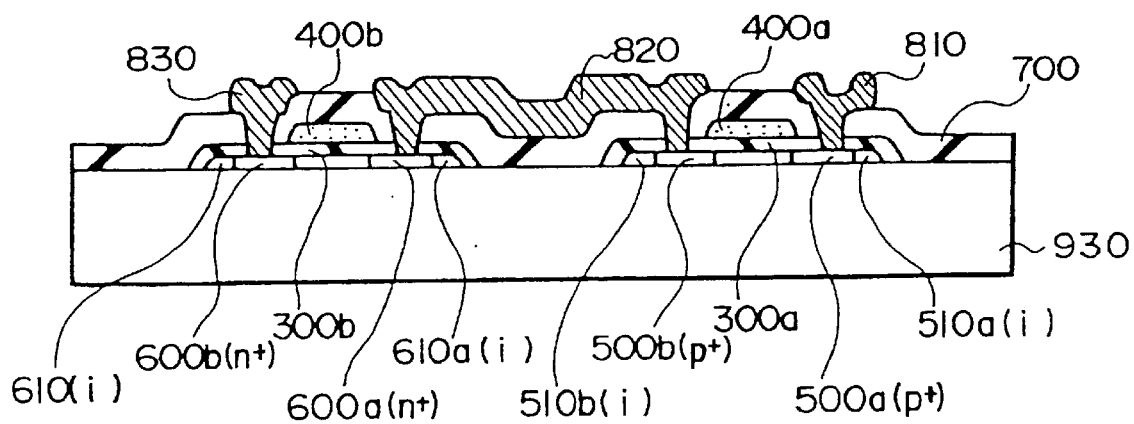
FIG. 31 is a drawing showing a seventh step for manufacturing a CMOS (TFT) of the present invention.

(Step 7) As shown in FIG. 31, a layer insulation film 700, and contact holes are selectively formed, and then electrodes 810, 820 and 830 are formed.

As described above, this embodiment enables the self alignment formation of the source layer and the drain layer inward of the outer edge of the polysilicon island by using the gate electrode and the insulation layer as masks. Namely, the intrinsic layer (i) layer can be automatically formed at the outer edge of the polysilicon island in the self alignment manner.

Figure 32:
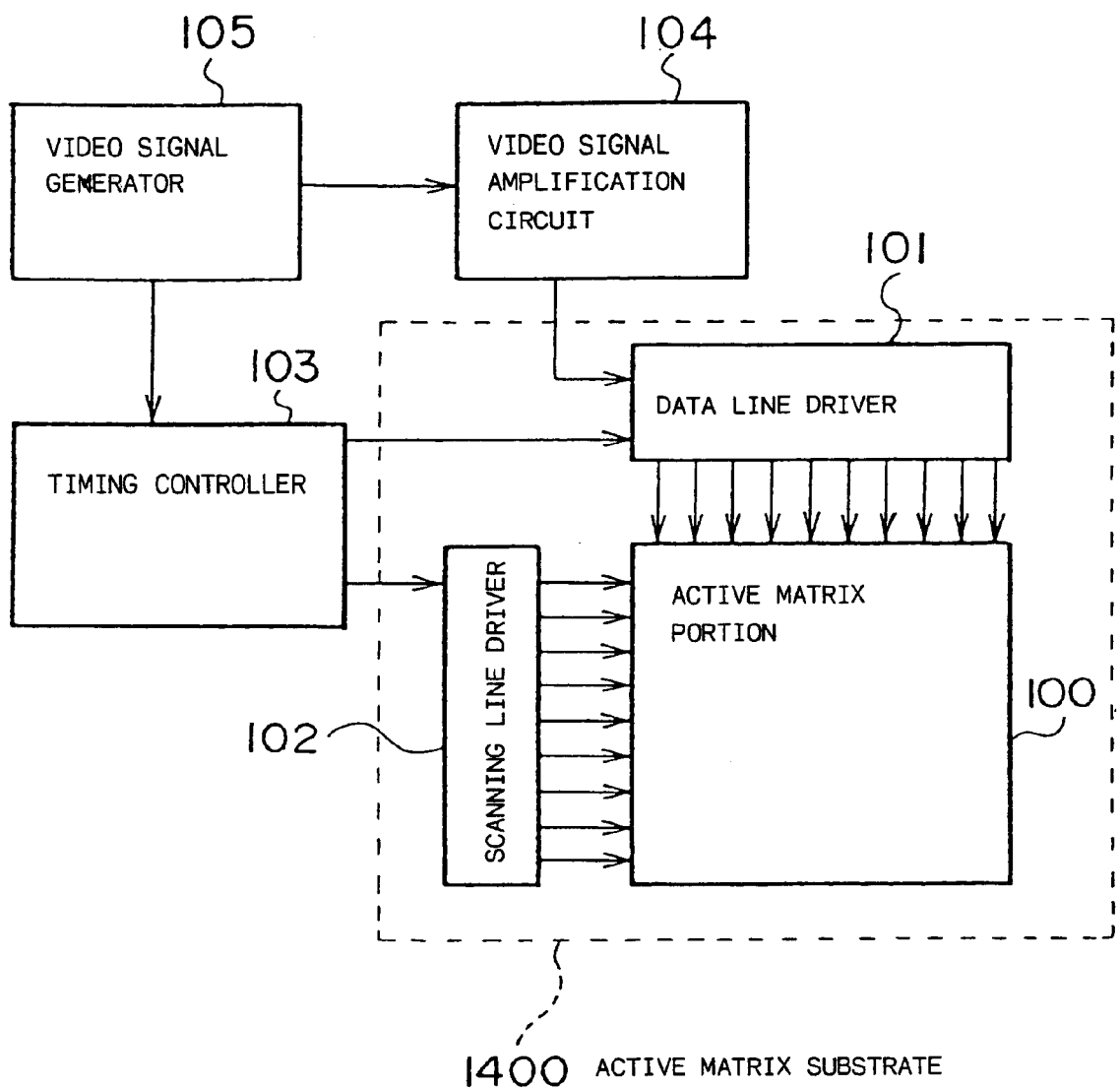
FIG. 32 is a block diagram showing the configuration of a liquid crystal display device.
Figure 33:
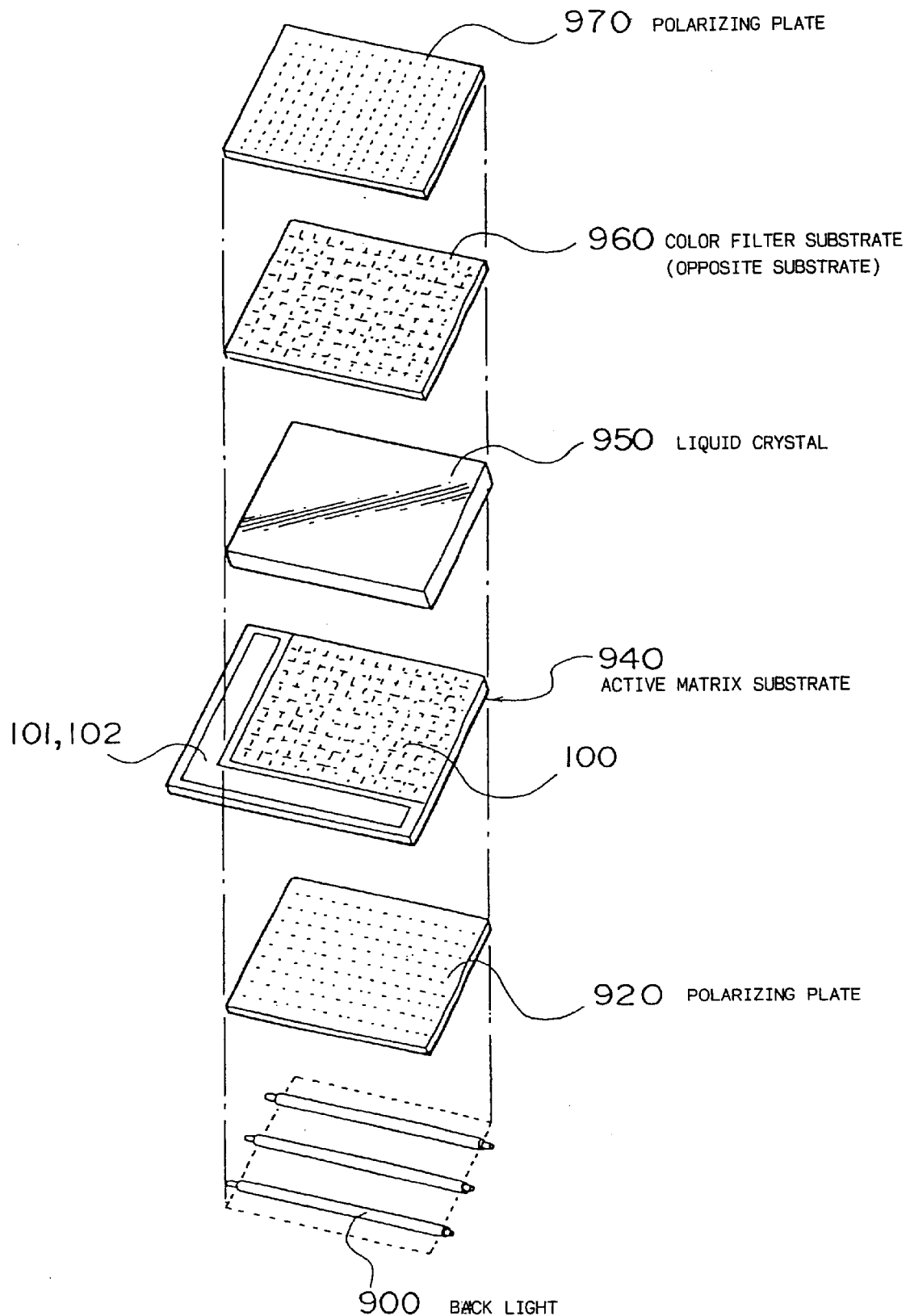
FIG. 33 is a block diagram showing the configuration of a liquid crystal display device.

FIGS. 32 and 33 shows the outline of a liquid crystal display device to which one of the first to eleventh embodiments of the present invention was applied.

A liquid crystal display device comprises, for example, an active matrix portion (pixel portion) 101, a data line driver 110, and a scanning line driver 102, as shown in FIG. 32. In FIG. 32, reference numeral 32 denotes a timing controller; reference numeral 104, a video signal amplification circuit; and reference numeral 105, a video signal generator.

In this embodiment, a TFT of the active matrix portion (pixel portion) 101, and a TFT which constitutes the data line driver 110 and the scanning line driver 102 have the structure shown in any one of FIGS. 16 and 22 to 24.

Also, as shown in FIG. 33, not only a TFT of the pixel portion 100 but also a TFT which constitute the data line driver 110 and the scanning line driver 102 are formed on an active matrix substrate 940 in the same manufacturing process. Namely, the liquid crystal display device comprises a on-board driver type active matrix substrate 940.

The liquid crystal display device comprises a back light 900, a polarizing plate 920, the active matrix substrate 940, a liquid crystal 950, a color filter substrate (opposite substrate) 960 and a polarizing plate 970, for example, as shown in FIG. 33.

In the liquid crystal display device of this embodiment, the leakage current (off current) of a TFT of the pixel portion is decreased, and variations in luminance of the display screen are decreased. Also, the variations of the leakage current (off current) of the TFT are suppressed, thereby facilitating the design of the active matrix substrate. The liquid crystal display device is provided with a high performance liquid crystal driver circuit comprising the TFT of the present invention, and thus exhibits high performance.

Figure 34:
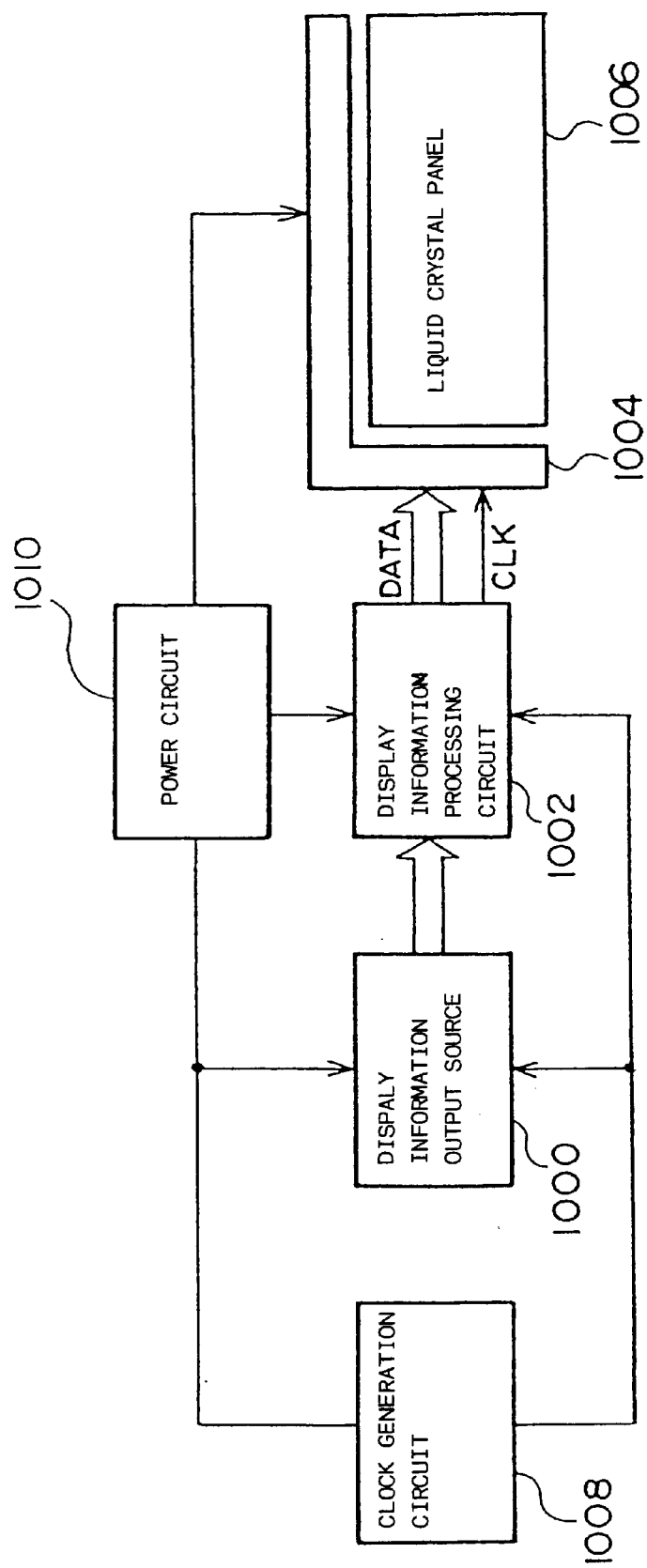
FIG. 34 is a drawing showing an electronic apparatus comprising a liquid crystal display device in accordance with an embodiment.

An electronic apparatus comprising the liquid crystal display device of the above described embodiment comprises a display information output source 1000, a display information processing circuit 1002, a display driving circuit 1004, a display panel 1006 such as a liquid crystal panel, a clock generation circuit 1008 and a power circuit 1010, as shown in FIG. 34. The display information output source 1000 comprises memory, such as ROM, RAM, etc., a tuning circuit for tuning television signals and outputting the signals, etc. so as to output display information such as video signals on the basis of the clock generated from the clock generation circuit 1008. The display information processing circuit 1002 processes display information and outputs it on the basis of the clock generated from the clock generation circuit 1008. The display information processing circuit 1002 comprises, for example, an amplification-polarity reversing circuit, a phase development circuit, a rotation circuit, a gamma correction circuit or a clamp circuit. The display driving circuit 1004 comprises a scanning side driving circuit and a data side driving circuit for driving the liquid crystal panel 1006 to display an image. The power circuit 1010 supplies electric power to each of the above circuits.

Figure 35:
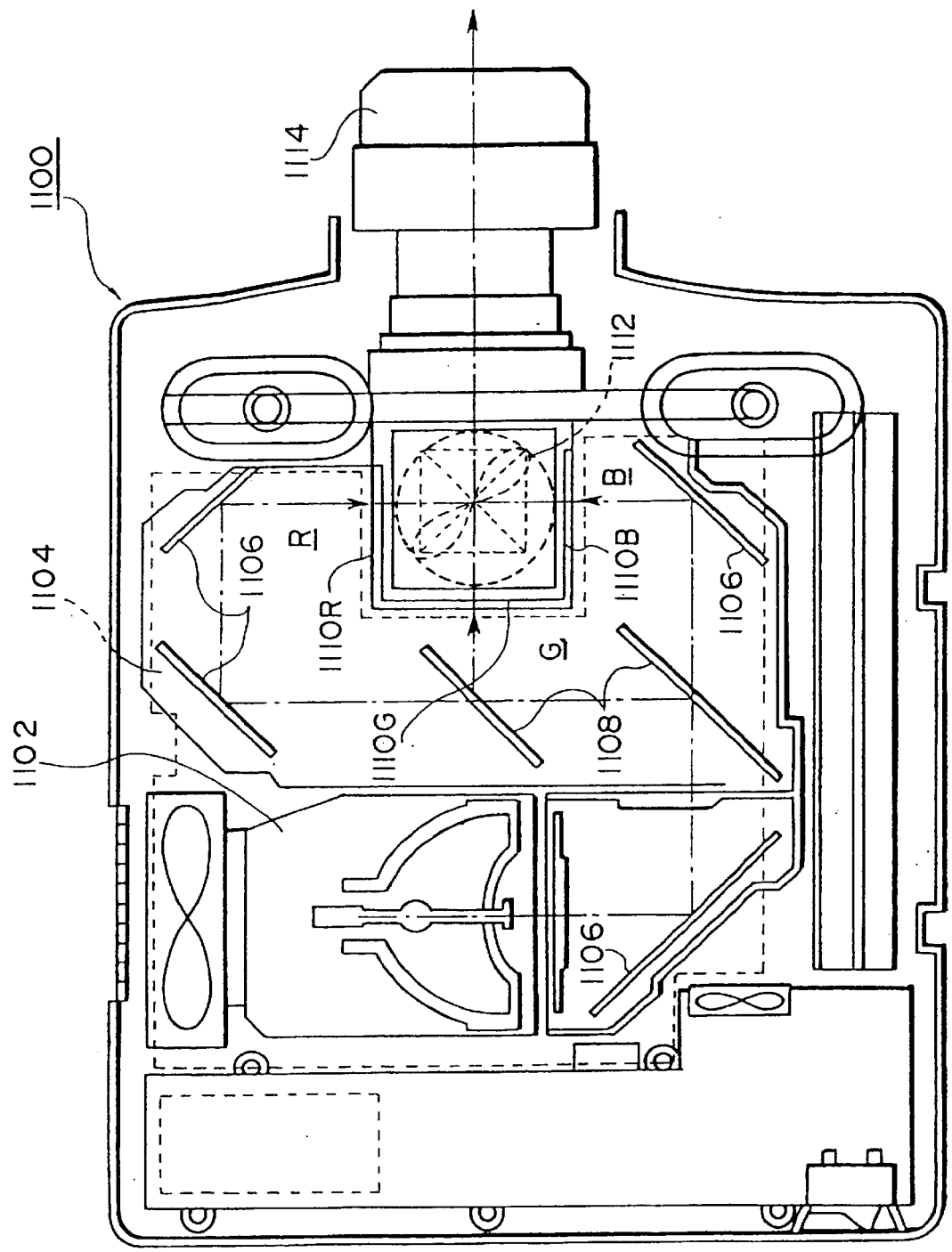
FIG. 35 is a drawing showing a liquid crystal projector comprising a liquid crystal display device in accordance with an embodiment.
Figure 36:
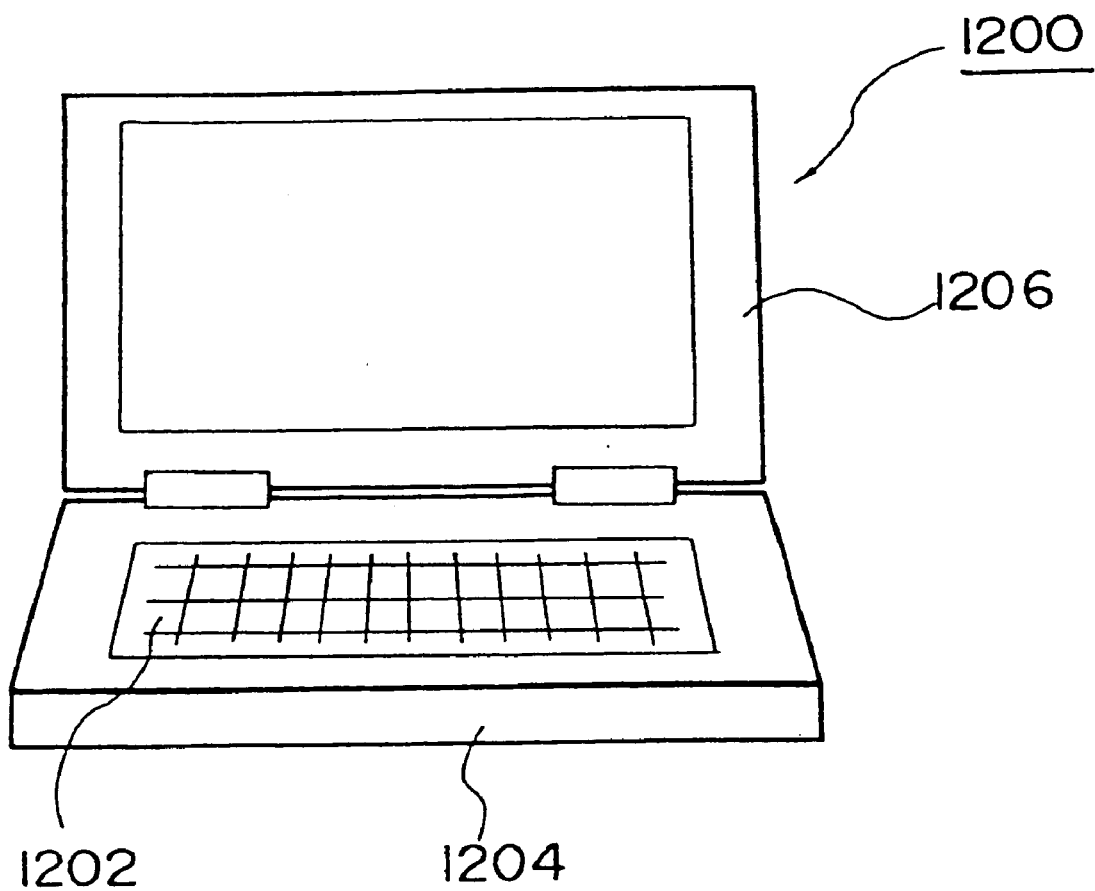
FIG. 36 is a drawing showing a personal computer comprising a liquid crystal display device in accordance with an embodiment.
Figure 37:
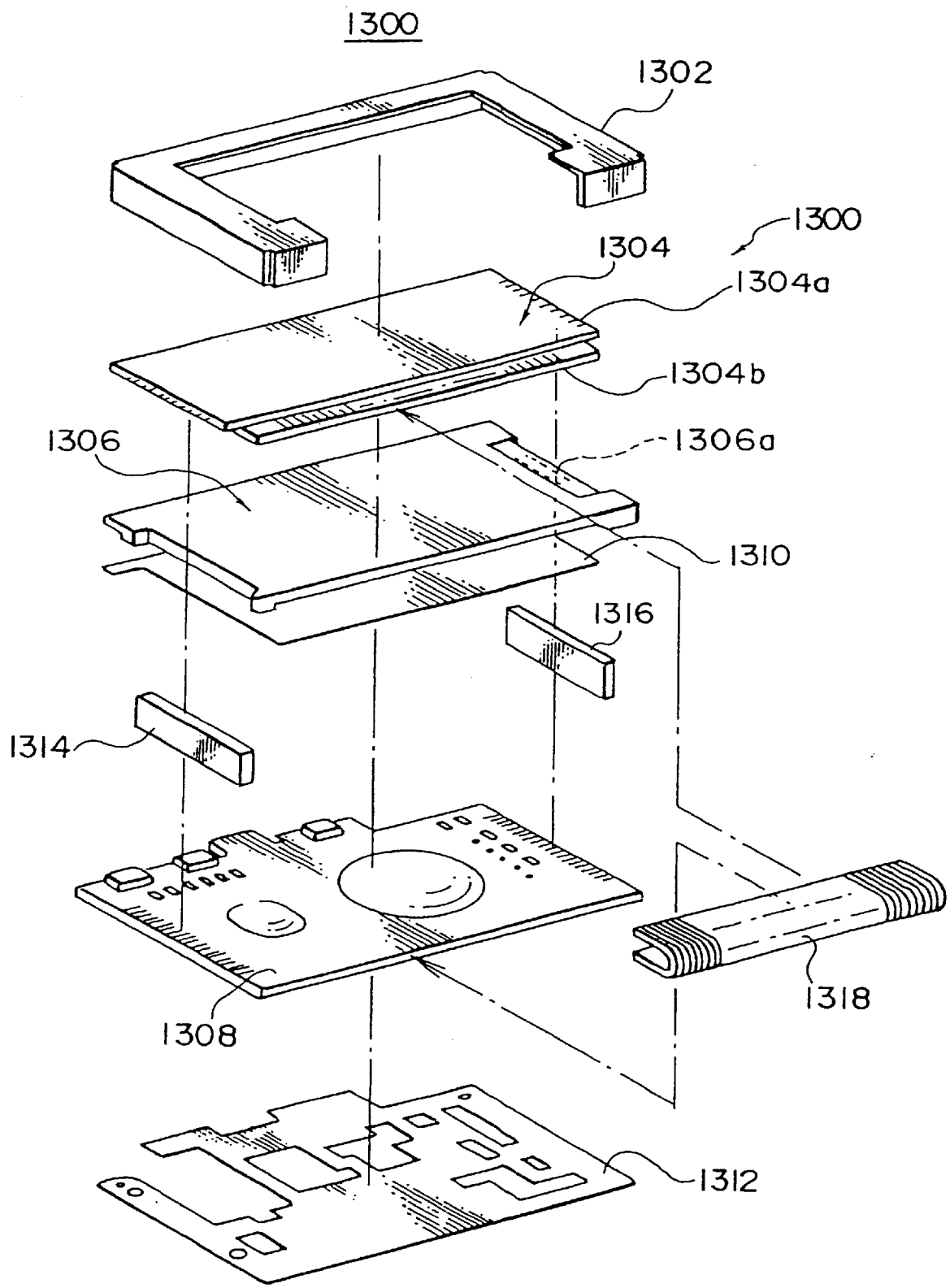
FIG. 37 is a drawing showing a pager comprising a liquid crystal display device in accordance with an embodiment.
Figure 38A:
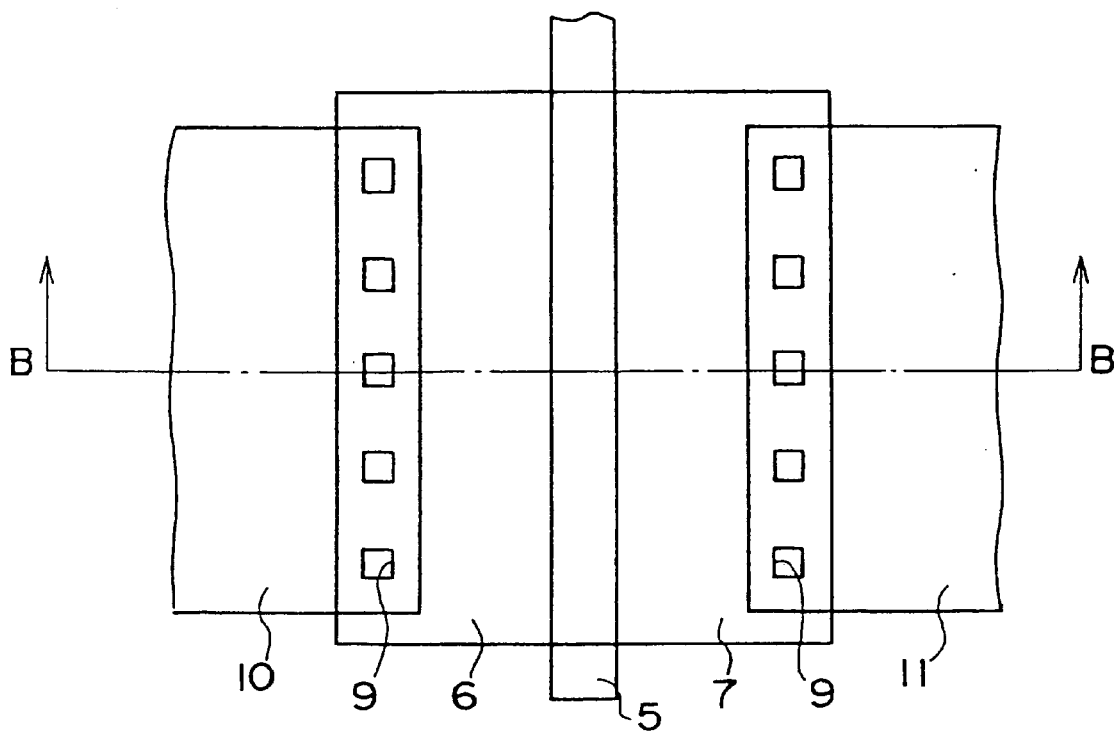
FIGS. 38A and 38B are drawings showing an example of conventional thin film transistors.
Figure 38B:
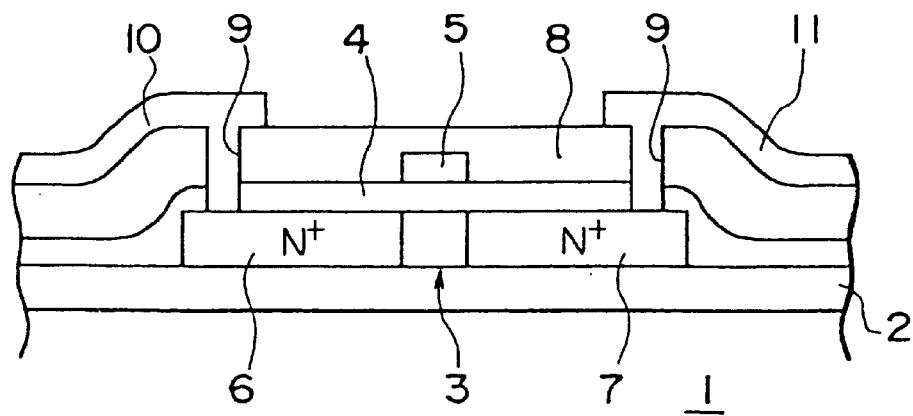

Examples of such an electronic apparatus constructed as described above include the liquid crystal projector shown in FIG. 35, the multi-media personal computer shown in FIG. 36, an engineering work station (EWS), the pager shown in FIG. 37, a portable telephone, a word processor, a television, a view finder type or monitor direct-viewing type video tape recorder, an electronic notebook, an electronic table calculator, a car navigator, a POS terminal, an apparatus with a touch panel, and the like.

The liquid crystal projector shown in FIG. 35 is a projection type projector comprising a transmission type liquid crystal panel as a light valve, and comprises, for example, a three-prism optical system.

In FIG. 35, in a projector 1100, the projection light emitted from a lamp unit 1102 as a white light source is divided into the primary colors R, G and B by a plurality of mirrors 1106 and two dichroic mirrors 1108 in a light guide 1104, which are guided to three liquid crystal panels 1110R, 1110G and 1110B for respectively displaying images of these colors. The rays of light modulated by the liquid panels 1110R, 1110G and 1110B are incident on a dichroic prism 1112 from three directions. In the dichroic prism 1112, since red R light and blue B light are bent at 90 degrees, and green G light travels straight, the images of these colors are combined, and a color image is projected on a screen through a projection lens 1114.

The personal computer 1200 shown in FIG. 36 comprises a body 1204 comprising a key board 1202, and a liquid crystal display screen 1206.

The pager 1300, shown in FIG. 37, comprises a liquid crystal board 1304, a light guide 1306 provided with a back light 1306a, a circuit board 1308, first and second shielding plates 1310 and 1312, two elastic conductors 1314 and 1316, and a film carrier tape 1318, all of which are contained in a metallic frame 1302. The two elastic conductors 1314 and 1316 and the film carrier tape 1318 are adapted for connecting the liquid crystal display board 1304 and the circuit board 1308.

The liquid crystal display board 1304 comprises two transparent substrates 1304a and 1304b and a liquid crystal sealed therebetween to form at least a dot matrix type liquid crystal display panel. On one of the transparent substrates the driving circuit 1004 may be formed as shown in FIG. 34, or the circuit and the display information processing circuit 1002. Circuits which are not carried on the liquid crystal display board 1304 are external circuits of the liquid crystal display board, and in the case shown in FIG. 37, such external circuits can be carried on the circuit board 1308.

Since FIG. 37 shows the configuration of the pager, besides the liquid crystal display board 1304, the circuit board 1308 is required. In cases wherein the liquid crystal display device is used as a component of an electronic apparatus and wherein the display driving circuit is carried on the transparent substrate, the minimum unit of the liquid crystal display device is the liquid crystal display board 1304. The liquid crystal display board 1304 fixed to the metallic frame serving as a casing can also be used as a liquid crystal display device serving as a component of an electronic apparatus. In the case of a backlight type display, a liquid crystal display device can comprise the liquid crystal display board 1304 and the light guide 1306 provided with the back light 1306, which are incorporated into the metallic frame 1302. In addition, as shown in FIG. 24, TCP (Tape Carrier Package) 1320 in which a IC chip 1324 is carried on a polyimide tape 1322 having a metallic conductive film formed thereon is connected to one of the two transparent substrates 1304a and 1304b which constitute the liquid crystal display board 1304 so that the TCP can be used as a liquid crystal display device as a component of an electronic apparatus.

The present invention is not limited to the above embodiments. For example, the present invention can be applied to not only drive each of the above various liquid crystal panels but also electroluminescence and plasma display devices.

The present invention can also be applied to a LDD structure MOSFET.

Although, in the first to fourth embodiments, a N-channel TFT has been described as an example, the problem of characteristic deterioration due to hot carriers likely occurs in the P-channel TFT in a level which is not so pronounced as the N-channel TFT. Therefore, the present invention can also be applied to the P-channel TFT. In this case, N-type impurity-diffused regions may be formed in place of the P-type impurity-diffused regions in the first and second embodiments. As for the silicon thin film which forms the channel region and the source and drain regions, not only may a polycrystalline silicon thin film be used, but also an amorphous silicon thin film may be used.

Further, specified values of the dimensions of the P-type impurity-diffused regions and the number of the P-type impurity-diffused regions formed in the first and second embodiments, the dimensions of the projecting portions in the third embodiment, or the width of each of the channel regions and the total width thereof in the fourth embodiment can be appropriately designed. In a liquid crystal display device, the thin film transistor of the present invention can be applied to not only the pixel transistor and analog switch but also various circuit components. Although, in the above embodiments, a top gate type thin film transistor has been described as an example, the present invention can also be applied to a bottom gate type thin film transistor.

What is claimed is:

1. A thin film transistor, comprising:
   a channel region formed in a non-single crystal silicon thin film;
   first and second regions of a first conduction type formed in the non-single crystal silicon thin film to be separated with the channel region therebetween;
   a carrier injection region into which carriers of the conduction type opposite to the first conduction type generated in a high electric field region near the first or second region flow; and
   a first and a second electrodes being in contact with the first and second regions, respectively.
   wherein the electrodes are separated from the carrier injection region.

2. A thin film transistor, comprising:
   a channel region formed in a non-single crystal silicon thin film;
   first and second regions of a first conduction type formed in the non-single crystal silicon thin film to be separated with the channel region therebetween;
   at least one third region of a conduction type opposite to the first conduction type formed between the first and second regions in the non-single crystal silicon thin film; and
   a first and a second electrodes being in contact with the first and the second regions, respectively.
   wherein the electrodes are separated from the third region.

3. The thin film transistor according to claim 2, further including a plurality of the third regions formed on the non-single crystal silicon thin film.

4. The thin film transistor according to claim 2, the third region being formed between at least one of the first region and second region, and the channel region in the non-single crystal silicon thin film.

5. The thin film transistor according to claim 2, the third region being formed in at least a portion of the channel region.

6. A circuit, comprising:
   the thin film transistor according to claim 2.

7. A built-in driver circuit type liquid crystal display device, comprising:
   a thin film transistor according to claim 2.

8. A liquid crystal display comprising:
   If the circuit according to claim 6.

9. A liquid crystal display device according to claim 7, the thin film transistor being used as a transistor of an analogue switch circuit.

10. An electro-optical device comprising:
    the thin film transistor according to claim 2.

11. An electro-optical device comprising:
    the circuit according to claim 10.

12. An electro-optical device according to claim 11, the thin film transistor being used as a transistor of an analogue switch circuit.

13. An electronic apparatus comprising:
    the circuit according to claim 6.

14. An electronic apparatus comprising:
    the liquid crystal display device according to claim 7.

15. An electronic apparatus comprising:
    the electro-optical device according to claim 10.

16. An electro-optical device comprising:
    the transistor according to claim 1, and further comprising:
    a source line driver circuit, a gate line driver circuit, an analog switch circuit, and a pixel circuit,
    the source line driver circuit, the gate line driver circuit, the analog switch circuit, and the pixel circuit being formed on a substrate and at least one of the source line driver circuit, the analog switch circuit, and the pixel circuit includes the transistor.

* * * * *